(12) United States Patent
Yang

(10) Patent No.: US 11,699,495 B2
(45) Date of Patent: Jul. 11, 2023

(54) STRING DEPENDENT SLC RELIABILITY COMPENSATION IN NON-VOLATILE MEMORY STRUCTURES

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 98 days.

(21) Appl. No.: 17/349,118

(22) Filed: Jun. 16, 2021

(65) Prior Publication Data

US 2022/0406389 A1 Dec. 22, 2022

(51) Int. Cl.
G11C 16/00 (2006.01)
G11C 16/34 (2006.01)
G11C 16/26 (2006.01)
G11C 16/14 (2006.01)
G11C 16/10 (2006.01)

(52) U.S. Cl.
CPC ........ G11C 16/3495 (2013.01); G11C 16/102 (2013.01); G11C 16/14 (2013.01); G11C 16/26 (2013.01); G11C 16/3463 (2013.01)

(58) Field of Classification Search
CPC ..... G11C 16/0483; G11C 16/10; G11C 16/16; G11C 16/3495; G11C 16/08; G11C 16/14; G11C 16/26; G11C 16/3445; G11C 16/3459; G11C 16/06; G11C 16/3404; G11C 11/5635; G11C 16/28; G11C 5/025; G11C 16/0466; G11C 16/32; G11C 16/3436; G11C 16/349; G11C 16/34; G11C 16/3454; G11C 16/04; G11C 16/12; G11C 16/30; G11C 16/3409; G11C 16/3431; G11C 11/5628; G11C 16/20; G11C 16/24; G11C 16/3427; G11C 16/3468; G11C 5/144; G11C 5/148; G11C 7/20; G11C 8/08; G11C 11/4082; G11C 11/4087; G11C 11/4099; G11C 13/004; G11C 2013/0054; G11C 29/028; G11C 8/06; G11C 16/02;
(Continued)

(56) References Cited

U.S. PATENT DOCUMENTS 9,589,640 B2 * 3/2017 Moon .................... G11C 16/26

* cited by examiner

*Primary Examiner* — Thong Q Le
(74) *Attorney, Agent, or Firm* — Dickinson Wright PLLC; Steven C. Hurles

(57) ABSTRACT

A method for programming a memory block of a non-volatile memory structure, comprising determining whether a number of programming/erase cycles previously applied to the block exceeds a first programming/erase cycle threshold and, if the first threshold is exceeded, determining whether the number of programming/erase cycles previously applied to the block exceeds an extended programming/erase cycle threshold. Further, if the determination is made that the extended threshold is not exceeded, the method comprises applying a two-pulse per programming loop scheme to each of the outermost strings of the block and applying a single-pulse per programming loop scheme to all other strings of the block. Alternatively, or in addition thereto, relative to a programming/erase cycle threshold, one or more outermost strings of the block may be unpermitted to be further programmed, and a "sub-block" comprised of all valid strings of the block may be defined and permitted for further programming.

20 Claims, 17 Drawing Sheets

(58) Field of Classification Search
CPC ... G11C 16/225; G11C 2213/75; G11C 29/44; G11C 29/52; G11C 7/12; G11C 8/12
USPC ............ 365/185.11, 185.17, 185.15, 185.18, 365/185.19, 185.21, 185.28, 218
See application file for complete search history.

STRING DEPENDENT SLC RELIABILITY COMPENSATION IN NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for, during programming operations, compensating for the deleterious effects of variations existing amongst the oxide material thicknesses between individual storage elements of a memory structure by predictively applying different programming schemes amongst specific regions of the memory structure according to the relative position of each region within the structure. As a result, the life of the memory structure may be extended, and improvements may be made to the data reliability and retention.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices. Advances in non-volatile memory structures have led to significant increases in their storage density capability and a reduction in their power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein a threshold voltage ($V_{th}$) of the memory cell transistor is controlled by and dependent upon the amount of charge that is retained on the transistor's floating gate. Specifically, in a switch-like manner, a minimum amount of voltage that must be applied to the control gate of the transistor before the transistor is activated to permit conduction between its source and drain regions is, therefore, determined by the level of charge being retained on the floating gate. As a result, bit-value data can be programmed onto and erased from the cell by precisely changing the level of charge on the floating gate in order to change the threshold voltage ($V_{th}$) characteristic of the transistor. In an array structure, the memory cells are addressable by word lines (rows) and bit lines (columns). One type of non-volatile memory storage defined by this general structure is referred to as NAND flash memory based upon its electrical characteristics, which resemble a NAND logic gate.

As explained in detail below, the number of bits that can be stored in an individual memory cell is dependent upon the number of distinct voltage ranges that may be partitioned within the threshold voltage ($V_{th}$) window of that memory cell. For example, to store one bit of data (referred to as a binary data), the possible threshold voltage ($V_{th}$) of a memory cell can be divided into two voltage ranges, wherein the ranges are assigned as logical data "1" and "0" respectively. Accordingly, a memory cell of this storage density order may be referred to as a "single-level cell" or SLC.

By further partitioning the threshold voltage ($V_{th}$) window of a memory cell into additional distinct voltage ranges, multiple levels of information may be stored. A memory cell of this storage density order may be referred to as a "multi-state cell" or MLC. For example, in order to store two bits of data, the threshold voltage ($V_{th}$) window of a cell can be further partitioned into four distinct voltage ranges, with each range assigned a bit value equal to, for example, "11," "10," "01," and "00." Accordingly, following an erase operation, the cell's threshold voltage ($V_{th}$) is negative, which could be defined as logic "11." As such, the positive threshold voltages ($V_{th}$) can be used for the programmed states of "10," "01," and "00." In a further example, to store three bits of data, the threshold voltage ($V_{th}$) window of a cell may be partitioned into eight distinct voltage ranges, with each range assigned a bit value equal to, for example, "111," "110," "100," "010," "011," "000," "001," and "101." A memory cell of this storage density order may be referred to as a "tri-level," "triple-level cell," or TLC. In a further example, to store four bits of data, the voltage threshold window of a memory cell may be partitioned into 16 distinct voltage ranges (or states), wherein each voltage range is assigned a certain bit value that is equal to, for example, "1111," "1110," "1100," "1000," "0111," "0011," "0001," "0000," "0001," "1001" "1101," "1011," "0110," "0100," "0101," and "1010." A memory cell of this type of storage density may be referred to, for example, as a "quad-level cell" (QLC).

The specific relationship between the data programmed into a memory cell and the threshold voltage ($V_{th}$) levels of the memory cell depends on the data encoding pattern or data scheme adopted for the memory cells.

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure.

Accordingly, as the industry continues to achieve smaller sized memory cells with increased storage densities in order to store more data, this scaling of size entails certain performance and durability risks. In order to achieve the advantage of higher memory capacity for a fixed die size, smaller memory cells must be packed more closely together. Doing so, however, may result in an increased number of manufacturing, memory operation, and performance errors. For example, according to various observations, in a scalable memory structure, there is a distinct challenge in maintaining the stability and the uniformity across an entire memory structure with respect to the semiconductor materials used to fabricate certain memory storage elements of the scalable memory, wherein such nonuniformities can lead to performance limitations and inconsistencies in, for example, the reliability of the programming operations of a memory structure. As an example, there appears to be a distinct correlation, or dependence, between variations existing amongst the relative thicknesses of the multiple oxide (e.g., AlO or $SiO_2$) layers comprising a substructure (e.g., a memory cell, string or block) of a scalable memory (as a consequence of existing fabrication processes) and an inconsistency or unpredictability in, for example, the width of the natural threshold voltage (NTV) distribution range of a given memory cell. As described below, a memory cell that has a relatively wider natural threshold voltage (NTV) distribution range results in a relatively large voltage swing between the programming and erase operations of a single programming and erase (P/E) cycle. Further, over successive P/E cycles, a voltage swing of this magnitude may cause a "wear-and-tear" damage to the integrity of the semiconductor layers (MANOS) of the memory cell, thus leading to changes in the electrical behavior of the cell that may result in certain performance failures (e.g., loss of efficiency and data retention). Unfortunately, the presence or magnitude of variations in thicknesses amongst the multiple oxide layers is significantly more pronounced in the higher-density, bit-scalable (BiCS) memory devices, likely due to the compact and stacked nature of their storage elements, as well as their associated circuitry. In addition, this particular issue occurs at a higher frequency with respect to heavily cycled memory cells (e.g., SLC-type memory cells in which data is rapidly and repeatedly programmed and erased in a single P/E cycle).

To compensate for these types of disturbances or inaccuracies, various algorithmic methods exist for identifying, filtering and/or correcting noise and bit errors during the read operation and subsequent processing, as well as summarily discontinuing programming (i.e., setting a fail status to) entire memory elements. However, these overarching and generalized mitigation measures add complexity and latencies to the memory operations. In addition, the wholesale application of these measures in some instances may prematurely end the life of the memory. Accordingly, there is a particular need for an improved mitigation or compensation mechanism that can operate during a programming operation and in a predictive manner that harnesses, or takes into consideration, the observed connection between the variable thicknesses of the oxide layers of a memory substructure and the exhibited width of the natural threshold voltage (NTV) distribution range of the memory cell(s) of the substructure.

SUMMARY

Various embodiments include a method for the programming of a memory block of a memory structure of a non-volatile memory system, wherein the method comprises determining whether a number of programming/erase cycles previously applied to a first memory block of the memory structure exceeds a first pre-defined programming/erase cycle threshold and, if the threshold is exceeded, designating one or more outermost memory strings of the first memory block as invalid such that they cannot be further programmed, defining a memory "sub-block" comprised of all valid memory strings of the first memory block, and identifying a free memory block of the memory "sub-block" to be programmed.

Other embodiments include a method for the programming of a memory block of a memory structure of a non-volatile memory system, wherein the method comprises determining whether a number of programming/erase cycles previously applied to a first memory block of the memory structure exceeds a first pre-defined programming/erase cycle threshold and, if the threshold is exceeded, determining whether the number of programming/erase cycles previously applied to the first memory block exceeds an extended pre-defined programming/erase cycle threshold, wherein the extended programming/erase cycle threshold is greater than the first programming/erase cycle threshold. Further, if the determination is made that the extended programming/erase cycle threshold is not exceeded, the method comprises applying a two-pulse per programming loop scheme to each outermost memory string of the first memory block and applying a single-pulse per programming loop scheme to all other memory strings of the first memory block.

Additional embodiments include a memory controller, wherein the memory controller comprises a first communication pathway that is configured to couple to a non-volatile memory structure. In addition, the memory controller is configured to determine whether a number of programming/erase cycles previously applied to a first memory block of the memory structure exceeds a first pre-defined programming/erase cycle threshold and, if the threshold is exceeded, designate one or more outermost memory strings of the first memory block as invalid such that they cannot be further programmed, define a memory "sub-block" comprised of all valid memory strings of the first memory block, and identify a free memory block of the "sub-block" to be programmed.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1:
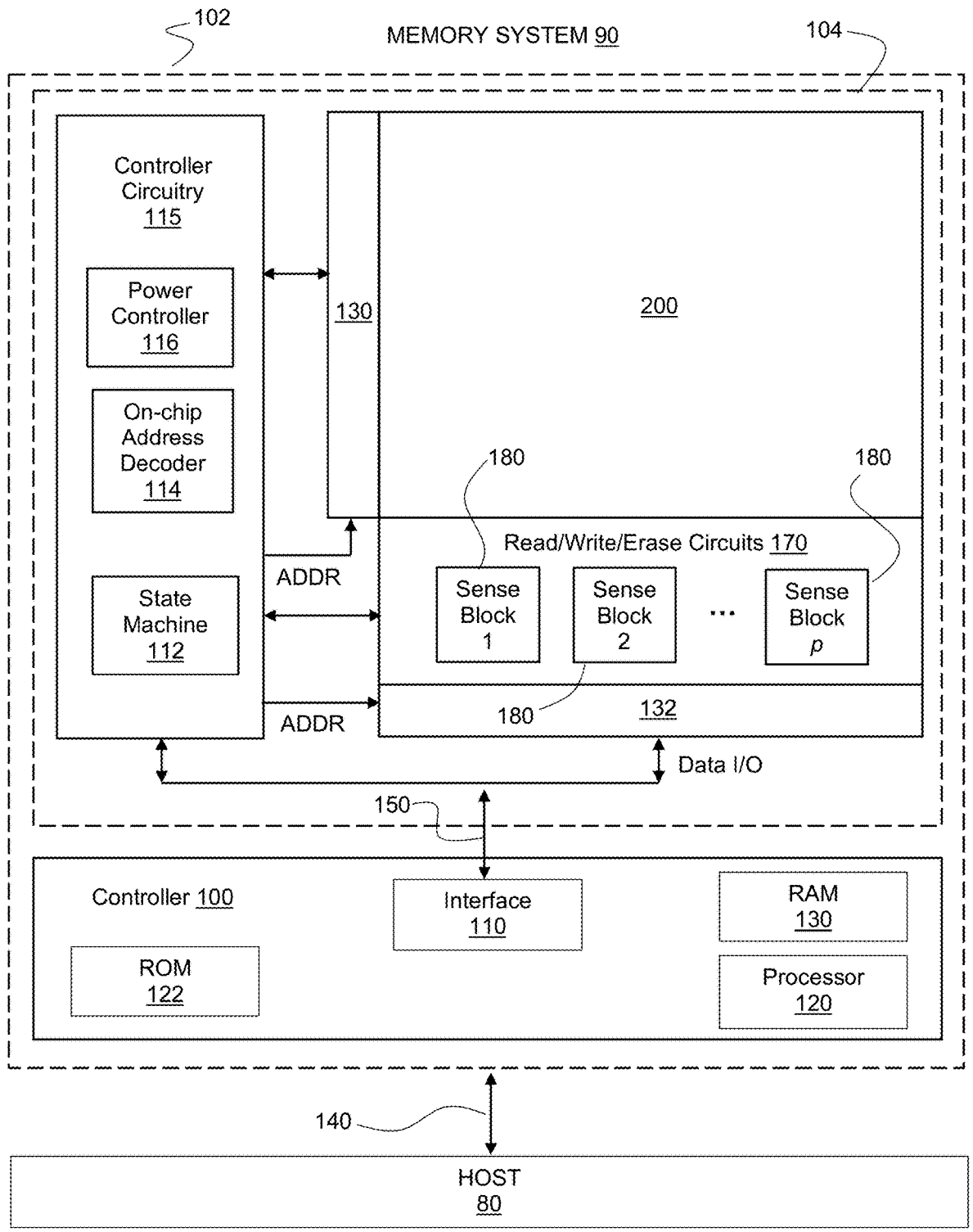
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

Figure 2:
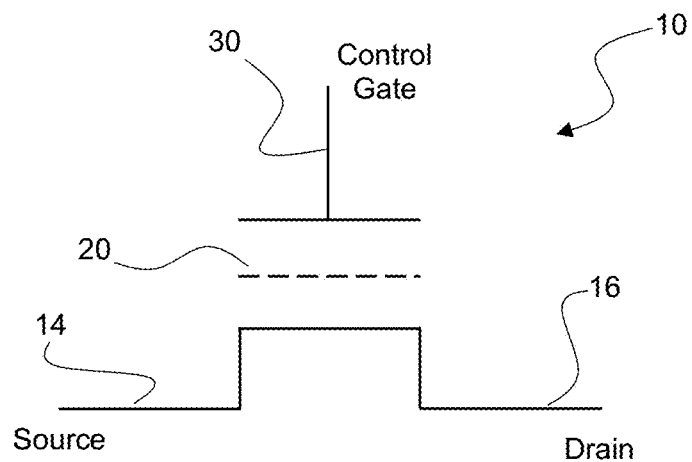
FIG. 2 schematically depicts a non-volatile memory cell, in accordance with exemplary embodiments.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

Figure 3:
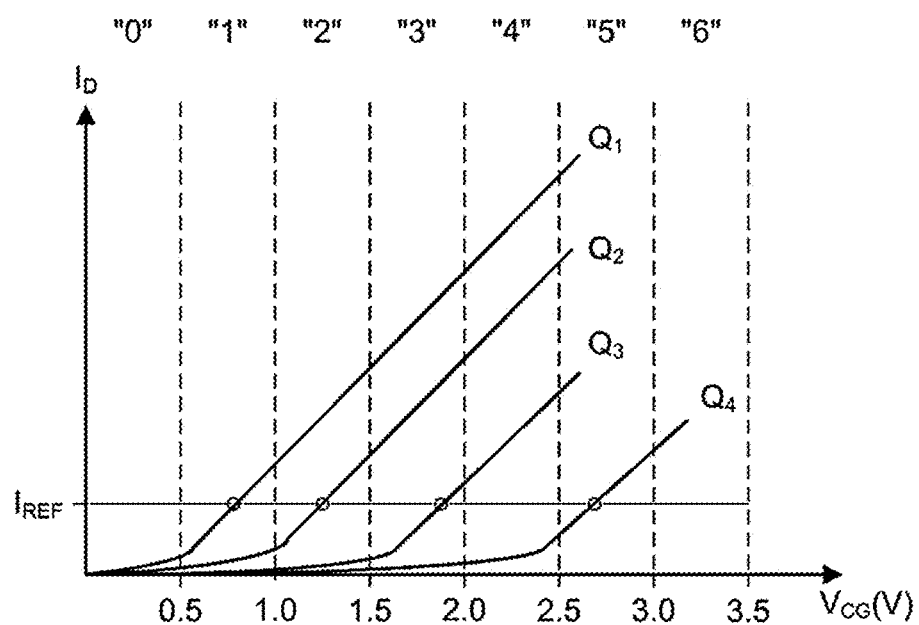
FIG. 3 depicts the relationship between a source-drain current ID and a control gate voltage VCG for four different charges Q1-Q4 that a floating gate of a non-volatile memory cell may be selectively storing at any one time at a fixed drain voltage, in accordance with exemplary embodiments.

FIG. 3 provides a graphical illustration of the correlation between the source-drain current ID and control gate voltage VCG for, for example, a non-volatile memory cell 10 having four different charge states Q1-Q4 that the floating gate may be selectively storing at any given time. As shown, with a fixed drain voltage bias, there exists four solid ID versus VCG curves representing four charge levels (or states) that can be programmed onto a floating gate of the memory cell, wherein the four charge levels respectively correspond to four of eight possible memory states. Therefore, as an example, the threshold voltage ($V_{th}$) window of a population of memory cells may range from 0.5 V to 3.5 V. In such an example, seven programmed memory states assigned as "0," "1," "2," "3," "4," "5," and "6," respectively, and one erased state (not shown in FIG. 3), may be demarcated by partitioning the threshold voltage ($V_{th}$) window into regions at intervals of 0.5 V each. Accordingly, if a reference current $I_{REF}$, of 2 µA is used as depicted, then a memory cell that is programmed with Q1 voltage may be considered to be in a memory state "1" as its curve intersects with $I_{REF}$ in the region of the threshold voltage ($V_{th}$) window that is demarcated by the voltage range VCG=0.5 V and 1.0 V. Similarly, Q4 is in a memory state "5."

Thus, as mentioned above, the more states that a memory cell 10 is made to store, the more finely divided is its threshold voltage ($V_{th}$) window. For example, in a memory cell 10 having a threshold voltage ($V_{th}$) window ranging from −1.5 V to 5 V, and thereby providing a possible maximum width (or distribution) of 6.5 V and storage across 16 memory states, each memory state may only occupy a voltage range of, for example, 200 mV to 300 mV. However, such a narrow voltage range will require higher precision in both the programming and read memory operations to achieve the required resolution.

Figure 4A:
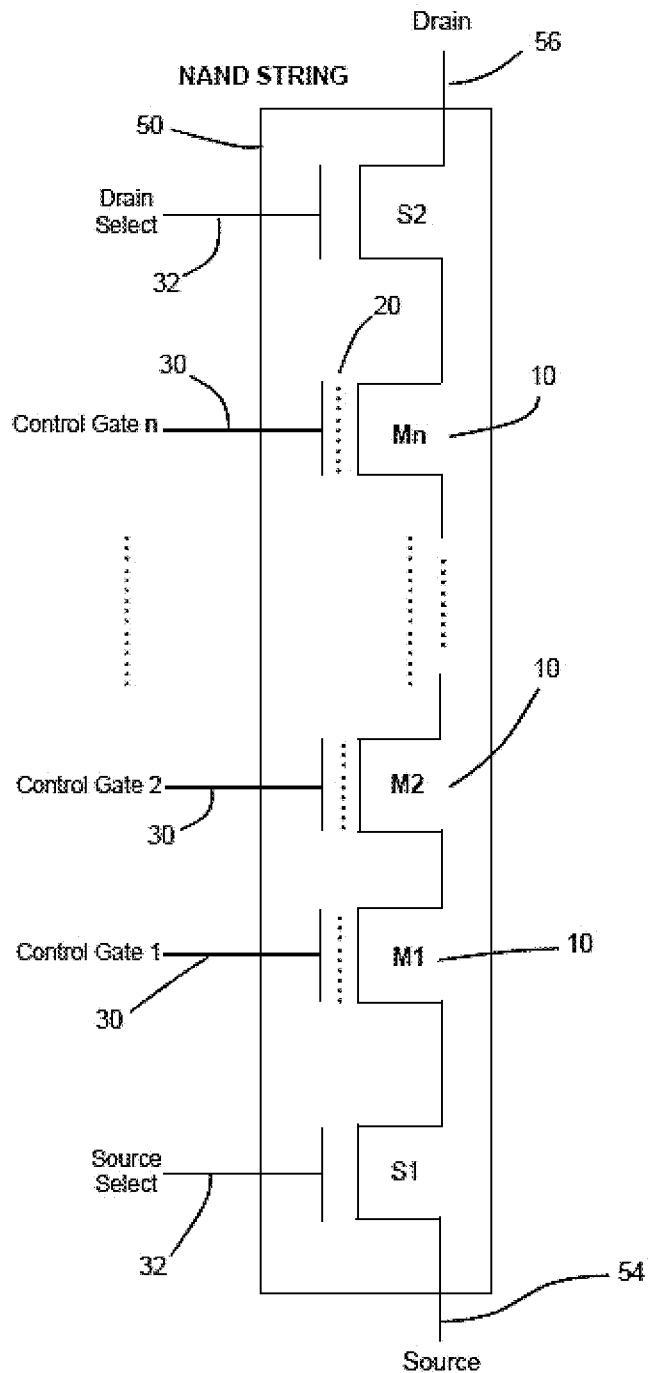
FIG. 4A schematically depicts a series of NAND-type memory cells organized into a string, in accordance with exemplary embodiments.

According to certain exemplary embodiments, the individual memory cells 10 are organized into one or more strings, wherein each string is comprised of memory cells placed in series. For example, depicted in FIG. 4A is an exemplary embodiment of a string 50 that is comprised of NAND-type memory cells placed in a series configuration, wherein the transistor elements, i.e., $M_1$, $M_2$, . . . , $M_n$ (in which "n" may equal 4, 8, 16, or higher), are daisy-chained at their source and drain regions. Further, as discussed above with respect to FIG. 2, each of the memory transistors 10 in a string 50 has a charge storage element 20 (e.g., a floating gate) for storing a certain amount of charge therein so as to represent an intended memory state of that memory cell, wherein each memory transistor 10 comprises a control gate 30 that allows for control over the read and write memory operations. Present at the source terminal 54 and drain terminal 56 of the string 50 are select transistors S1, S2 that control the memory transistor's connection to the outlaying memory array. Specifically, when the source select transistor S1 is turned on, source terminal 54 of string 50 is coupled to a source line (SL). Likewise, when the drain select transistor S2 is turned on, the drain terminal 56 of string 50 is coupled to a bit line (BL) of the memory array.

Figure 4B:
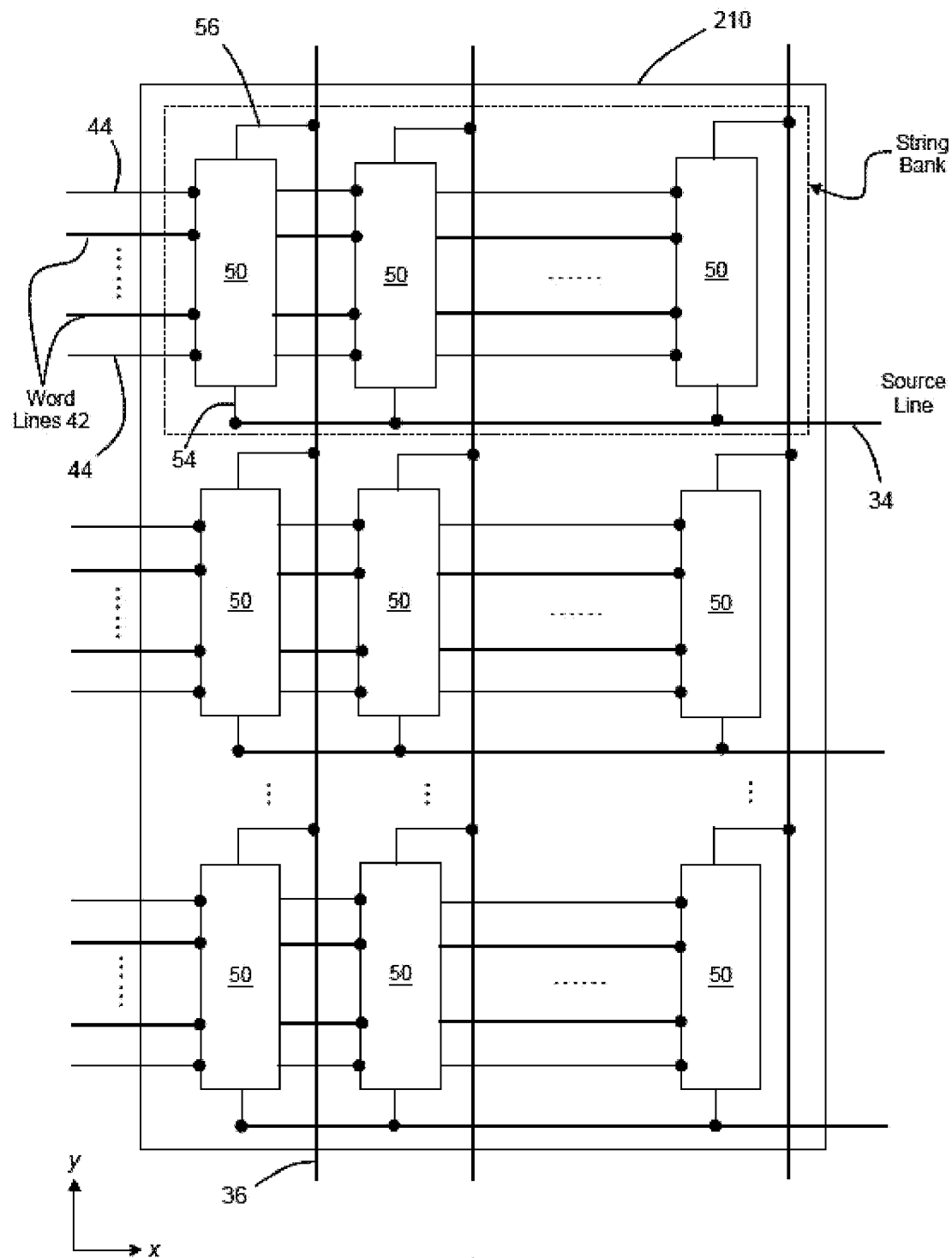
FIG. 4B schematically depicts a two-dimensional memory cell array, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 200 (such as memory array 210) comprised of a plurality of NAND strings 50 of the type illustrated in FIG. 4A. Along each column of NAND strings 50, a bit line (BL) 36 is coupled to the drain terminal 56 of each NAND string 50. In addition, along each bank of NAND strings 50, a source line (SL) 34 is coupled to the source terminals 54 of each NAND string 50. Further, the control gates 30 of the memory transistors 10 in a row of memory cells in the bank of NAND strings 50 are connected to the same word line (WL) 42. Therefore, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, an electrically conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines (WL) 42 and select lines 44 of the bank of NAND strings 50.

Figure 5:
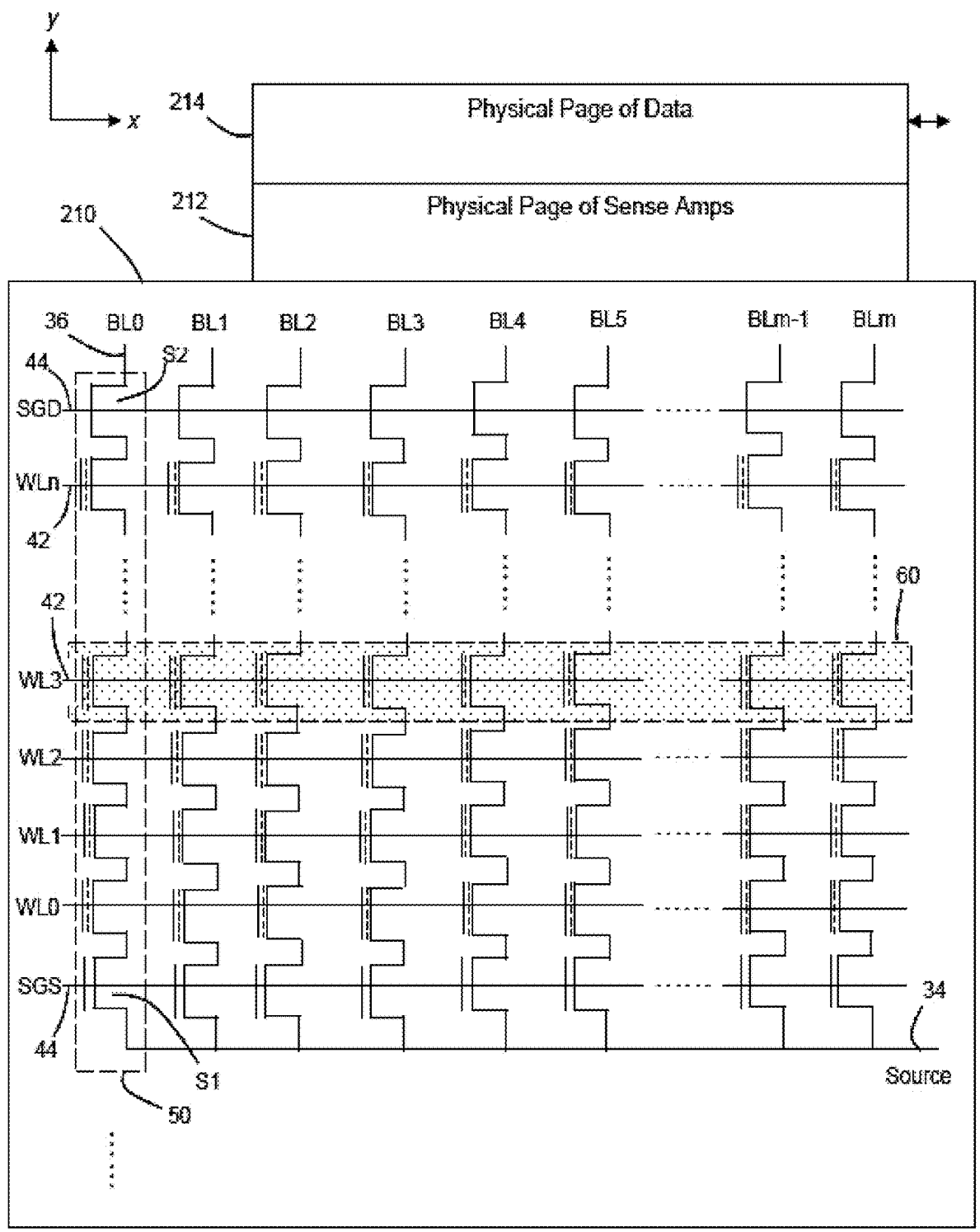
FIG. 5 depicts a page of memory cells being sensed or programmed in parallel, and in relation to a memory array organized in a NAND-type configuration, in accordance with exemplary embodiments.

Referring now to FIG. 5, depicted there is a detailed illustration of a bank of NAND strings 50 of a memory array 210 according to an exemplary embodiment thereof. This view is particularly useful in visualizing a row-by-row configuration of the memory array 210, wherein each row may be referred to as a physical "page." Accordingly, a physical page (e.g., page 60 denoted in FIG. 5) is a group of memory cells 10 that is enabled to be sensed or programmed in parallel. In such a configuration, a page is the smallest unit of the memory device that may be programmed or written to. Programming of a page is accomplished by a corresponding page of sense amplifiers (SA) 212, wherein each sense amplifier may be coupled to a respective NAND string 50 via a bit line (BL) (see e.g., the bit lines BL0, BL1, BL2, . . . , BLm−1, and BLm, as depicted in FIG. 5). Thus, a page 60 is enabled by the control gates of the plurality of memory cells 10 in page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

Figure 6:
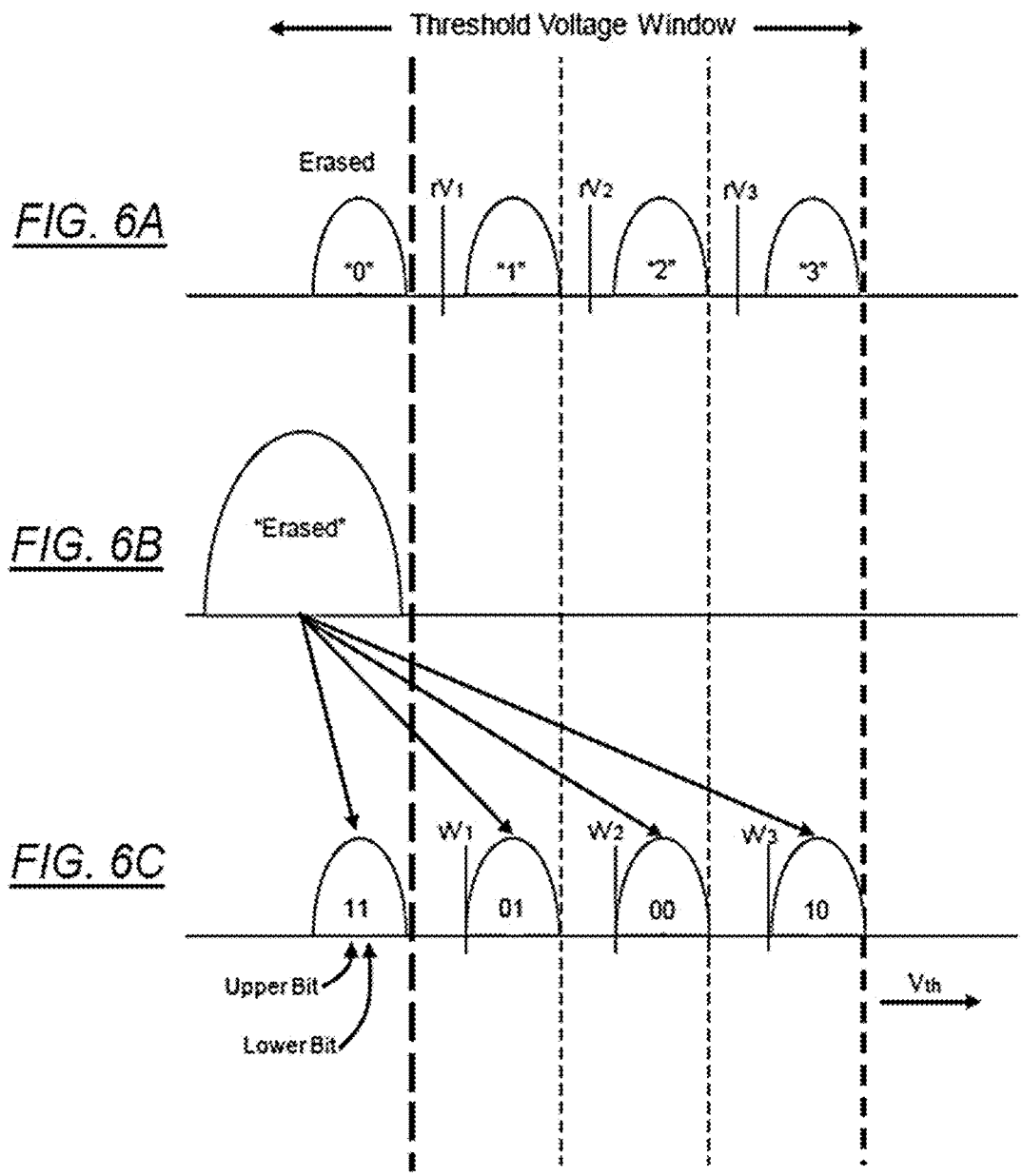
FIGS. 6A-C depict stages of programming four states of a population of MLC-type memory cells, in accordance with exemplary embodiments.

To illustrate an exemplary embodiment of the programming stages of, for example, a MLC memory device that is comprised of a population of four-state memory cells, reference is made to FIGS. 6A-C.

To illustrate an exemplary embodiment of the programming stages of, for example, a MLC memory device that is comprised of a population of four-state memory cells, reference is made to FIGS. 6A-C. In FIG. 6A, there is depicted a population of memory cells in which the characteristic threshold voltage ($V_{th}$) window is divided into four distinct voltage distributions, with each distribution corresponding to a programmable memory state (i.e., memory states "0," "1," "2," and "3"). FIG. 6B illustrates an initial distribution of "erased" threshold voltages ($V_{th}$) for an erased memory. In FIG. 6C, much of the memory cell population has been programmed such that the initial "erased" threshold voltage of a given memory cell 10 is moved to a higher value into one of the three divided voltage zones that are demarcated by verify levels $vV_1$, $vV_2$, and $vV_3$. Accordingly, each memory cell can be programmed to one of the three programmable states "1," "2," and "3," or remain in the "erased" state. On a bit level, a two-bit code having, for example, a lower bit and upper bit can be used to represent each of the four memory states. For example, as depicted in FIG. 6C, the memory states "0," "1," "2," and "3" may be assigned bit values "11," "01," "00," and "10" respectively. In such example, the two-bit data may be read from the memory by sensing in a "full-sequence" mode in which the two bits are, for example, sensed together by sensing relative to the corresponding read demarcation threshold voltages—rV1, rV2, and rV3—in three sub-passes respectively.

Figure 7:
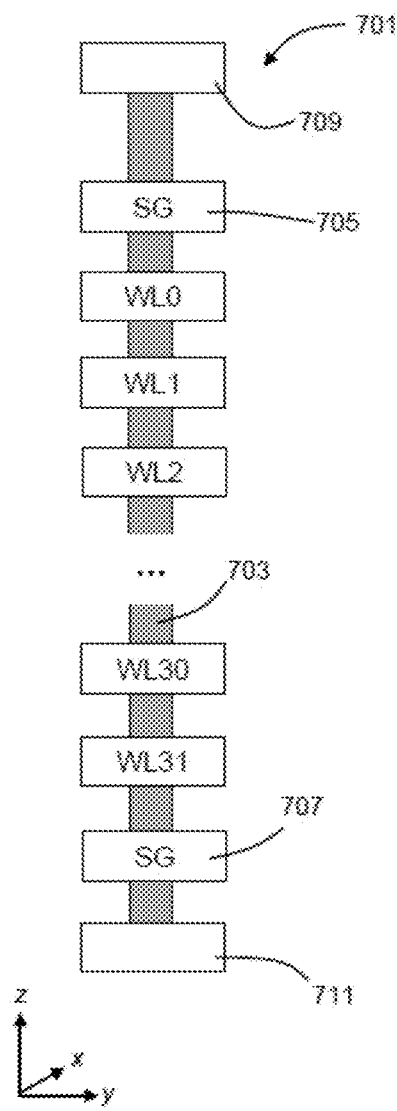
FIG. 7 depicts a vertical NAND-type string of a three-dimensional memory array, in accordance with exemplary embodiments.

In FIGS. 4A-B and 5 and the foregoing corresponding description, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). As a result, three-dimensional memory structures increase the storage density but consume less chip surface. For example, in FIG. 7 there is depicted an exemplary embodiment of a 3D NAND-type string 701, which is operated in a similar manner as a two-dimensional NAND-type string, such as the NAND-type string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string 701, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the NAND-type string 701 are select gates 705, 707, which allow for the selective connection to, or isolation from, external elements 709, 711 that include, for example, conductive lines (such as common source lines or bit lines) that serve large numbers of strings 701 of a memory array. In the particular embodiment shown in FIG. 7, the vertical NAND-type string 701 has 32 memory cells (i.e., at the juncture between the local bit line 703 and word lines 0 through 31) that are connected in series. However, a NAND-type string 701 may comprise any suitable number of memory cells.

Referring back to the overall architecture of a memory system that is, for example, depicted in FIG. 1, there is shown a schematic depiction of a typical arrangement of an example memory device 102. In this particular embodiment, the memory device 102 comprises one or more memory die 104 wherein each memory die 104 may include a two- or three-dimensional memory structure 200, such as the two- and three-dimensional memory arrays described above with respect to FIGS. 4A-B, 5 and 6, as well as the associated control circuitry 115 and read/write/erase circuits 170. For example, memory structure 200 may comprise a monolithic three-dimensional memory structure in which multiple memory levels are formed above (rather than in) a single substrate, such as a wafer, without any intervening substrates. Further, the memory structure 200 may be comprised of any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the memory structure 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 comprise multiple sense blocks 180 (Sense Block 1, Sense Block 2, . . . , Sense Block p) that are connectable via bit lines to the memory elements of the memory structure 200. The sense blocks 180 allow memory cells connected to a common word line (referred to as a "page" of memory cells) to be read or programmed in parallel. In some embodiments, a controller 100 is included in the same memory device 102 as the one or more memory die 104 or, in other embodiments, the controller 100 may be located separate from the memory die 104. In some embodiments, the controller 100 may be on an entirely different die from the memory die 104. Further, in certain embodiments, each memory die 104 may have its own controller 100 or, in other embodiments, one controller 100 may communicate amongst multiple memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the memory die 104 include input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host provides a logical address to which data is to be read/written, the controller 100 can convert the logical address received from the host to a physical address in the memory. Alternatively, the host can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. In some exemplary embodiments, each module may comprise an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 100 to perform the desired functions.

Additionally, the control circuitry 115 cooperates with the read/write/erase circuits 170 in performing memory operations (e.g., read, program, erase, etc.) with respect to memory structure 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by row and column decoders 130, 132. The power control module 116 controls the power and voltages that are supplied to the word lines and bit lines during memory operations. As such, the power control module 116 may comprise drivers for word line layers (with respect to a 3D memory configuration), select transistors, and source lines. Also, the power control module 116 may include charge pumps for generating voltages. The sense blocks 180 include the bit line drivers. Any one or any combination of control circuitry 115, state machine 112, decoders 114/130/132, power control module 116, sense blocks 180, read/write/erase circuits 170, and/or controller 100 can be considered a control circuit that performs the functions described herein.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Figure 8:
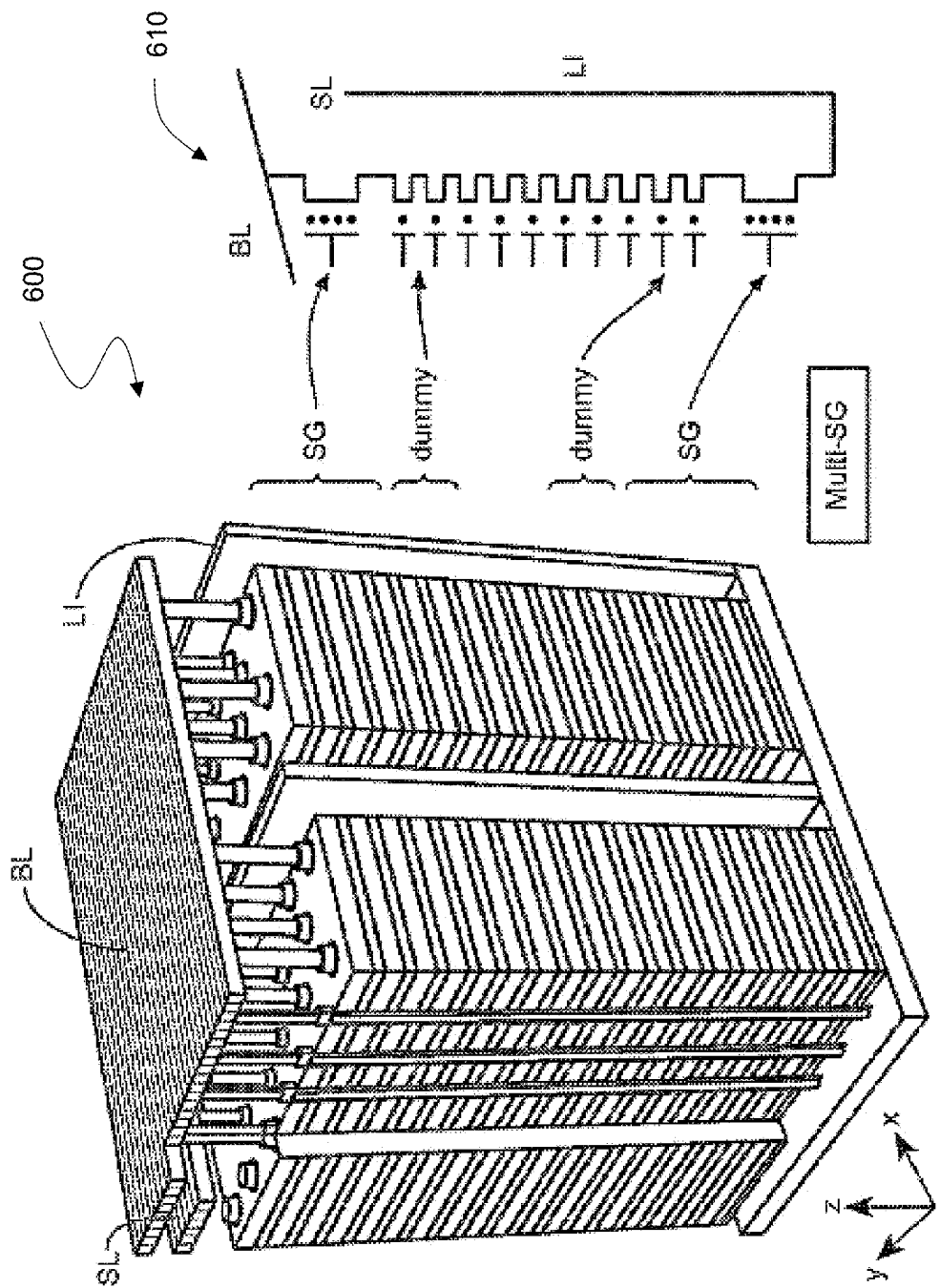
FIG. 8 is a perspective view of a representative subsection of a monolithic three-dimensional NAND-type memory array, in accordance with exemplary embodiments.

Referring now to FIG. 8, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 8 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SGS) connects the string 610 to a global source line (SL) through an associated local source line (LI). Further included in this particular embodiment are several dummy cells located at the ends of the string 610. Due to their proximity to select gates (SGD, SGS) and, thereby, their susceptibility to disturbs, the dummy cells are not used to store user data.

Figure 9:
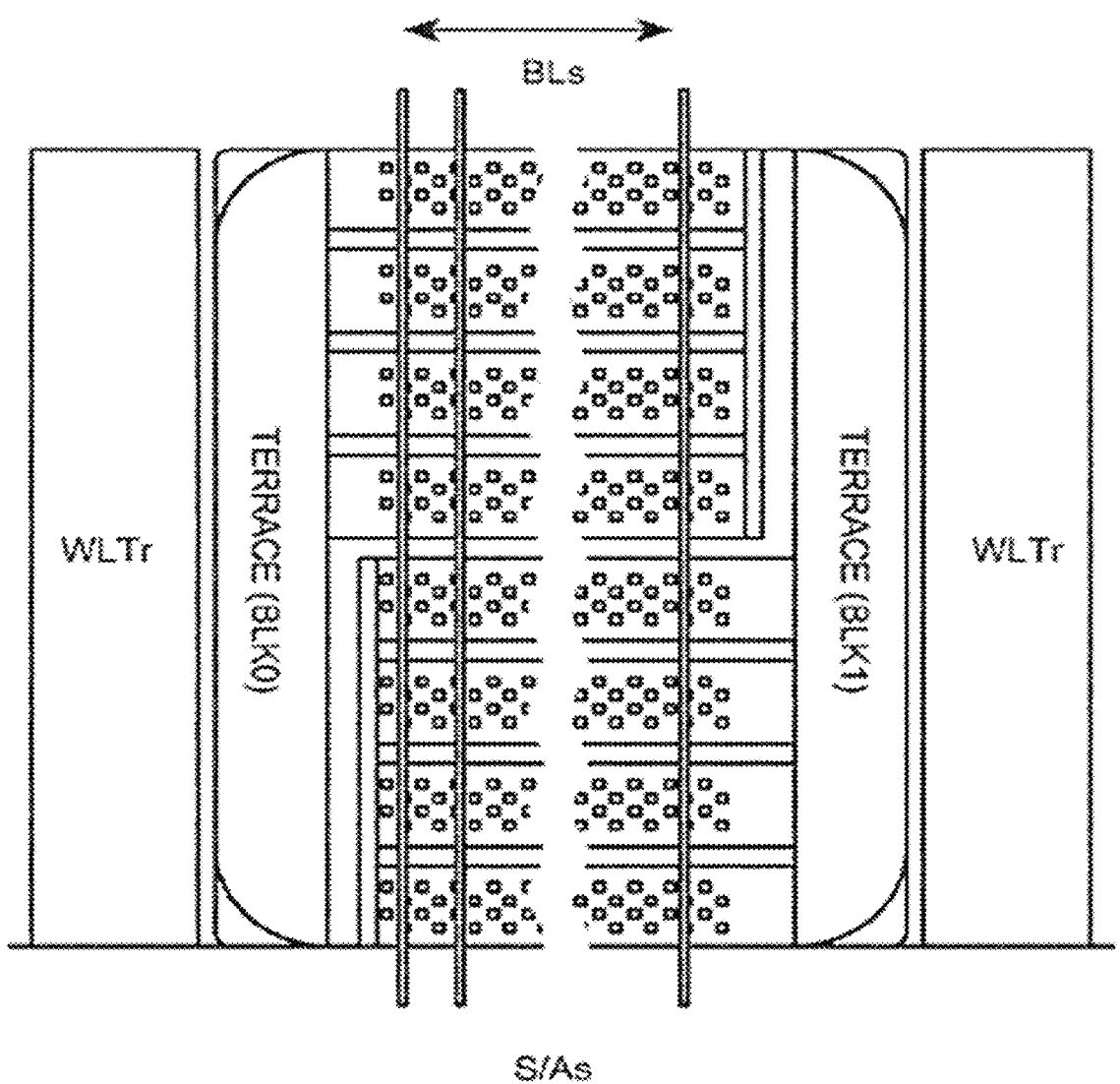
FIG. 9 is a top view of two representative blocks of the memory array of FIG. 8, in accordance with exemplary embodiments.

Turning to FIG. 9, there is shown a top view of two representative blocks (i.e., BLK0 and BLK1) of the array structure 600 of FIG. 8. According to this particular embodiment, each block is comprised of four extensions that extend from left to right. Further, the word lines and the select gate lines of each level also extend from left to right, wherein the word lines of the different extensions of the same block are commonly connected at a "terrace" from which they receive their various voltage levels by way of word line select gates (WLTr). It should also be noted that the word lines of a given layer of a block may be commonly connected on the far side from the terrace. Also, the selected gate lines can be individual, rather than common, for each level, thereby allowing for each extension to be individually selected. In addition, the bit lines (BLs) run vertically as depicted, and connect to the sense amplifier circuits (SAs) where, depending on the embodiment, each sense amplifier can correspond to a single bit line or be multiplexed to several bit lines.

Figure 10:
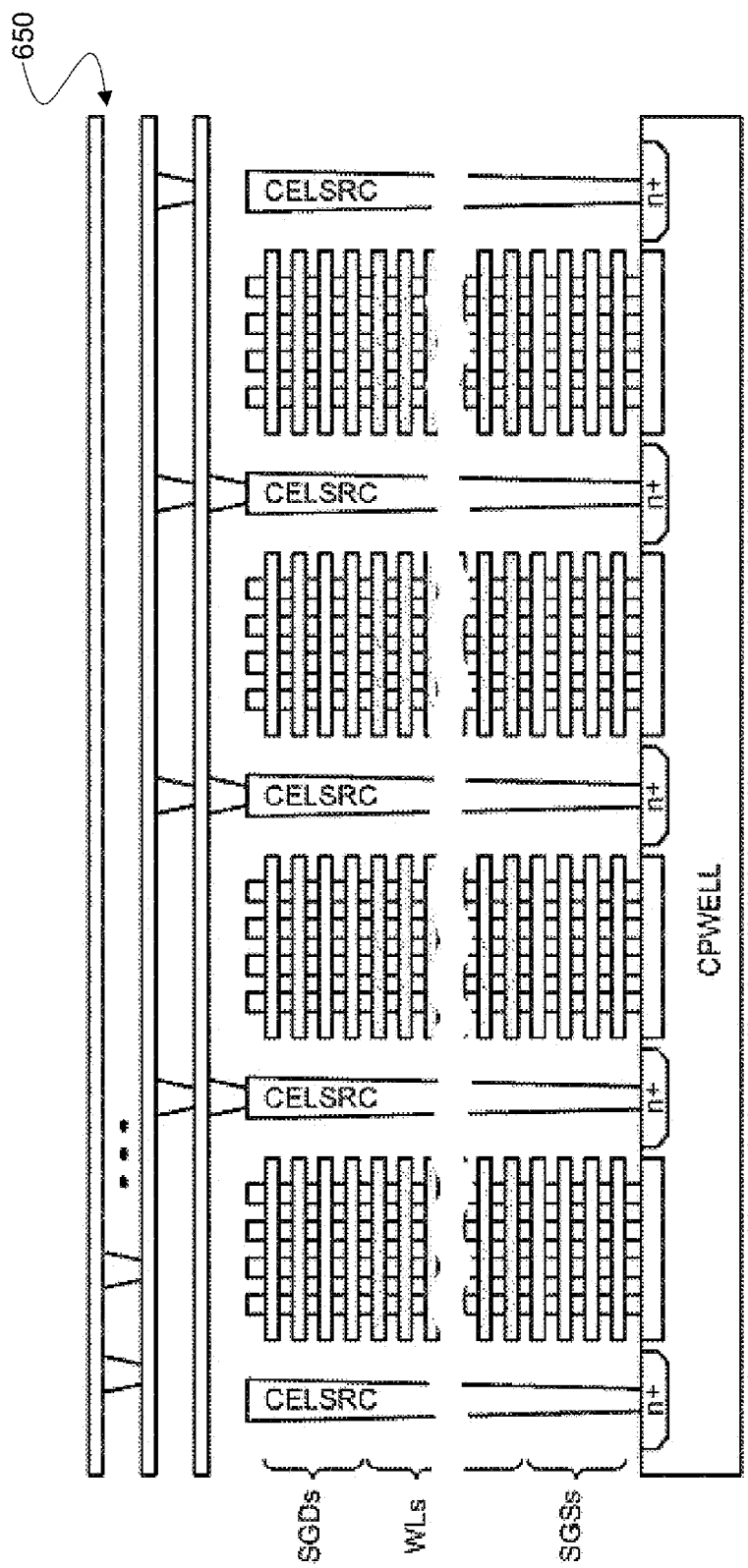
FIG. 10 is a side view of a representative block of the memory array of FIG. 8, in accordance with exemplary embodiments.

The side view that is provided in FIG. 10 shows the four extensions of an individual block 650 of the array structure 600 of FIG. 8 in greater detail. According to this particular embodiment, select gates (SGD, SGS) at either end of the NAND strings are formed with four layers, with the word lines (WLs) therebetween, all formed over a CPWELL. Accordingly, in order to select a given extension, the voltage level (VSG) of the select gates is set and the word lines (WLs) are biased according to the operation, either at a read voltage (VCGRV) for the selected word lines (WLs), or at a read-pass voltage (VREAD) for the non-selected word lines (WLs). The non-selected extensions may then be cut off by setting their select gates accordingly.

Returning now to the programming and erase memory operations with respect to non-volatile memory, these two operations may be generally described in the following manner. As described above, each cell comprises a floating gate MOS transistor, wherein the floating gate (FG) is an electrically isolated conductor. Accordingly, when programming a memory cell, a relatively high voltage is applied to the control gate of the memory cell (in the case of a two-dimensional array) or the appropriate word line (WL) (in the case of a three-dimensional array) and, as a result, electrons are injected into the floating gate by means of, for example, Fowler-Nordheim (F-N) Tunneling. Data bits are then stored by trapping charge on the floating gate, wherein the logic value is defined by its threshold voltage and the amount of electrical charge stored. Conversely, to erase a memory cell, electrons in the floating gate are removed by, for example, a process referred to as quantum tunneling, to the source and/or the semiconductor substrate. More specifically, in some exemplary embodiments, electrons are removed from the charge trapping layer (i.e., floating gate) by applying a low voltage to the control gate and increasing the channel voltage to a high voltage, thereby creating an electric field that causes electrons to be pushed back into the semiconductor substrate.

Figure 11:
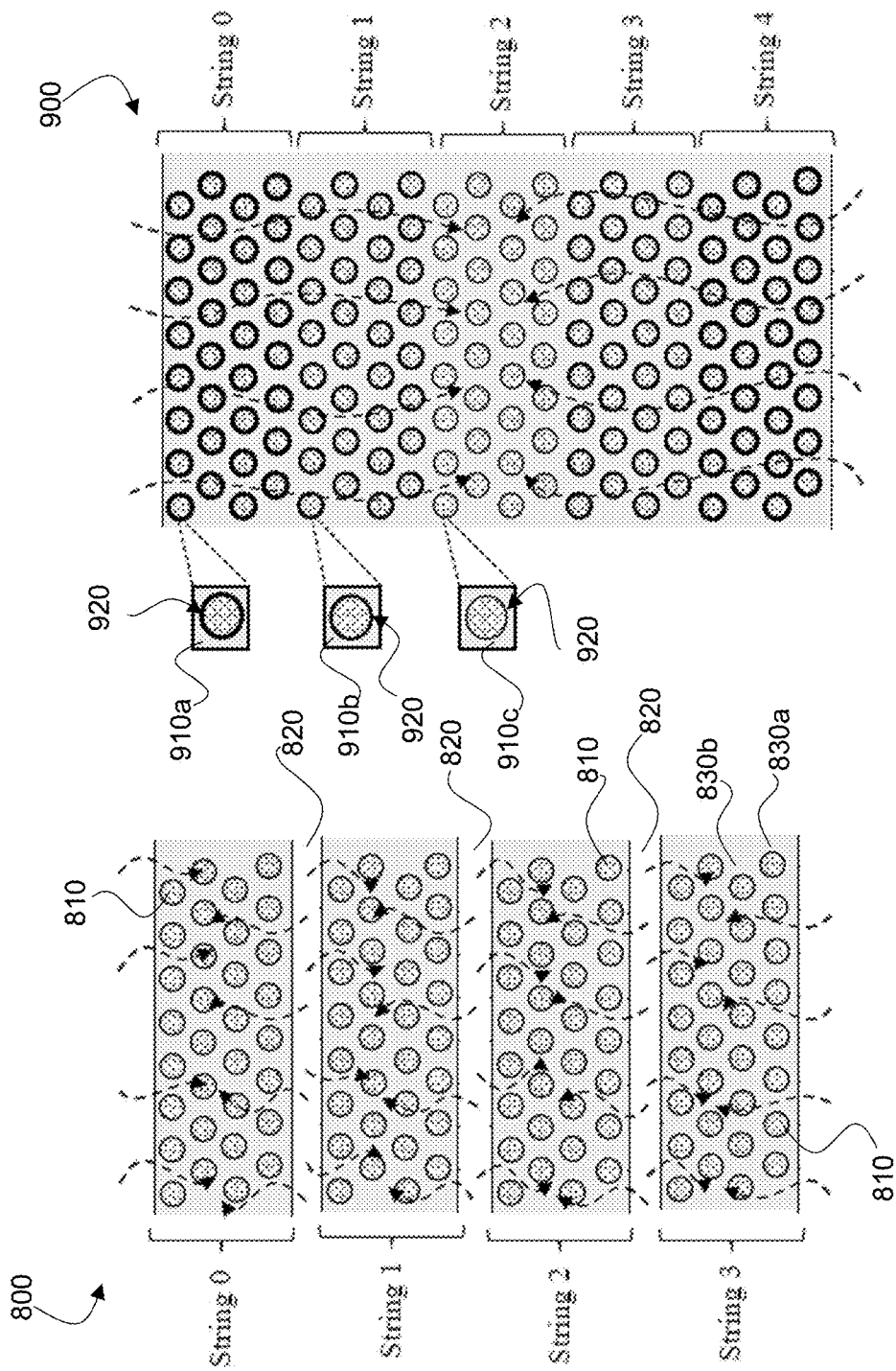
FIG. 11A is a diagrammatic illustration of a chemical deposition process as applied during the fabrication of a relatively lower density bit-scalable (BiCS) memory structure, in accordance with exemplary embodiments.
FIG. 11B is a diagrammatic illustration of a chemical deposition process as applied during the fabrication of a relatively higher density bit-scalable (BiCS) memory structure, in accordance with exemplary embodiments.

As mentioned above, these high storage density memory structures, such as the BiCS type described, for example, with respect to the embodiment depicted in FIGS. 8-10, have relatively small spacing between adjacent memory cells and each cell has a relatively small tolerance between discrete voltage ranges for memory functions. Accordingly, improving the amount of efficient storage capability within a fixed die size has competing drawbacks and liabilities. As previously mentioned, some challenges arise from the unintended structural variations occurring in the semiconductor materials comprising the memory structure as an intrinsic result of existing fabrication processes. For example, it is possible that, in a scalable memory structure, variations in the relative thicknesses of the oxide layers (e.g., AlO and $SiO_2$) between substructures of the memory (e.g., between memory cells, strings or blocks located in proximity to one another) may be encountered as an inherent development of the fabrication process. To illustrate one such phenomenon in a general manner, FIGS. 11A and 11B depict a side-by-side physical comparison between non-limiting examples of a lower density BiCS type memory structure 800 and a higher density BiCS type memory structure 900. Accordingly, in comparison, example memory structure 800 is comprised of four strings (i.e., Strings 0-3) with each string being comprised of memory elements 810 (e.g., memory cells/holes). Further, in this particular memory structure 800, each string is structurally separated from one or more adjacent strings by a "trench" or "channel" 820 that is formed at the edge of a respective word line (WL) of the string. During the fabrication of the memory structure, one key process in forming the memory cell or hole structure is the depositing of a "blocking AlO" through the hollow cell structure (e.g., pre-filled by SiN and later replaced by tungsten), thereby resulting in the oxide (MANOS) layers at each memory cell/hole 810. In general terms, this deposition process is indicated in FIG. 11A by the dotted arrows. Accordingly, at each string, the AlO chemicals will travel inward from the "trench" or "channel" 820, flowing from the outermost row 830a to the innermost row 830b. According to certain observations, the memory elements 810 that are first exposed to this inward-flowing deposition process (i.e., the memory elements of the outermost row(s) 830a) form a thicker MANOS deposit in comparison to memory elements 810 located further downstream (i.e., the memory elements of the inner row(s) 830b). Thus, as a result, the memory structure 800 may exhibit variations in the thicknesses of the MANOS layers across memory elements 810.

Conversely, in the example higher density BiCS type memory structure 900 that is depicted in FIG. 11B, the structure 900 is comprised of five strings (i.e., Strings 0-4) with each string also being comprised of a population of memory elements (e.g., memory cells/holes). Unlike the lower density memory structure 800 shown in FIG. 11A, in this particular structure 900, although each of Strings 0-4 are separately addressable, they are not physically separated from each other within the memory structure 900 itself. Rather, the strings form one continuous structure. As such, in the material deposition process described above, the AlO chemicals can only flow from the edge of the outermost strings (i.e., Strings 0 and 4) inward, as is indicated by the dotted arrows in FIG. 11B. Due to the continuous nature of memory structure 900, the deposited chemicals must traverse farther in order to reach the innermost string (i.e., String 2) when compared to the length of travel in the lower density memory structure 800. Specifically, according to the example structure 900, the deposited chemicals must traverse more than eight rows in order to reach the memory cells/holes of the innermost string (String 2), whereas in example structure 800, the deposited chemicals must traverse only one to two rows in order to reach the innermost memory cells/holes (i.e., in row 830b). Under certain circumstances, the memory cells/holes of Strings 0-4 of this type of structure 900 may, when examined, exhibit an increasingly thinner MANOS layer as one moves from the outer strings (i.e., Strings 0 and 4) of the structure 900 to the interior strings (i.e., Strings 1-3) of the structure such that the memory cells/holes of the innermost string (i.e., String 2) exhibit the thinnest oxide layer amongst the memory cells/holes of the structure 900. The variation amongst the oxide thicknesses from the outermost to the innermost memory strings may be relatively substantial and can become more pronounced in the higher density BiCS memory structures due to the increased length of travel that is required in the chemical deposition process. To generally illustrate this variation in thickness, a representative memory cell/hole from each of an outermost string (e.g., String 0), intermediate string (e.g., String 1), and innermost string (e.g., String 2) of the structure 900 is depicted on the left-hand side of FIG. 11B. As shown, the MANOS layer 920 of memory cell 910a of the outermost string is thicker than the respective MANOS layers 920 of both of the memory cells 910b and 910c of the intermediate and innermost strings of structure 900. Additionally, the MANOS layer 920 of memory cell 910b is slightly thicker than the MANOS layer 920 of memory cell 910c.

Figure 12:
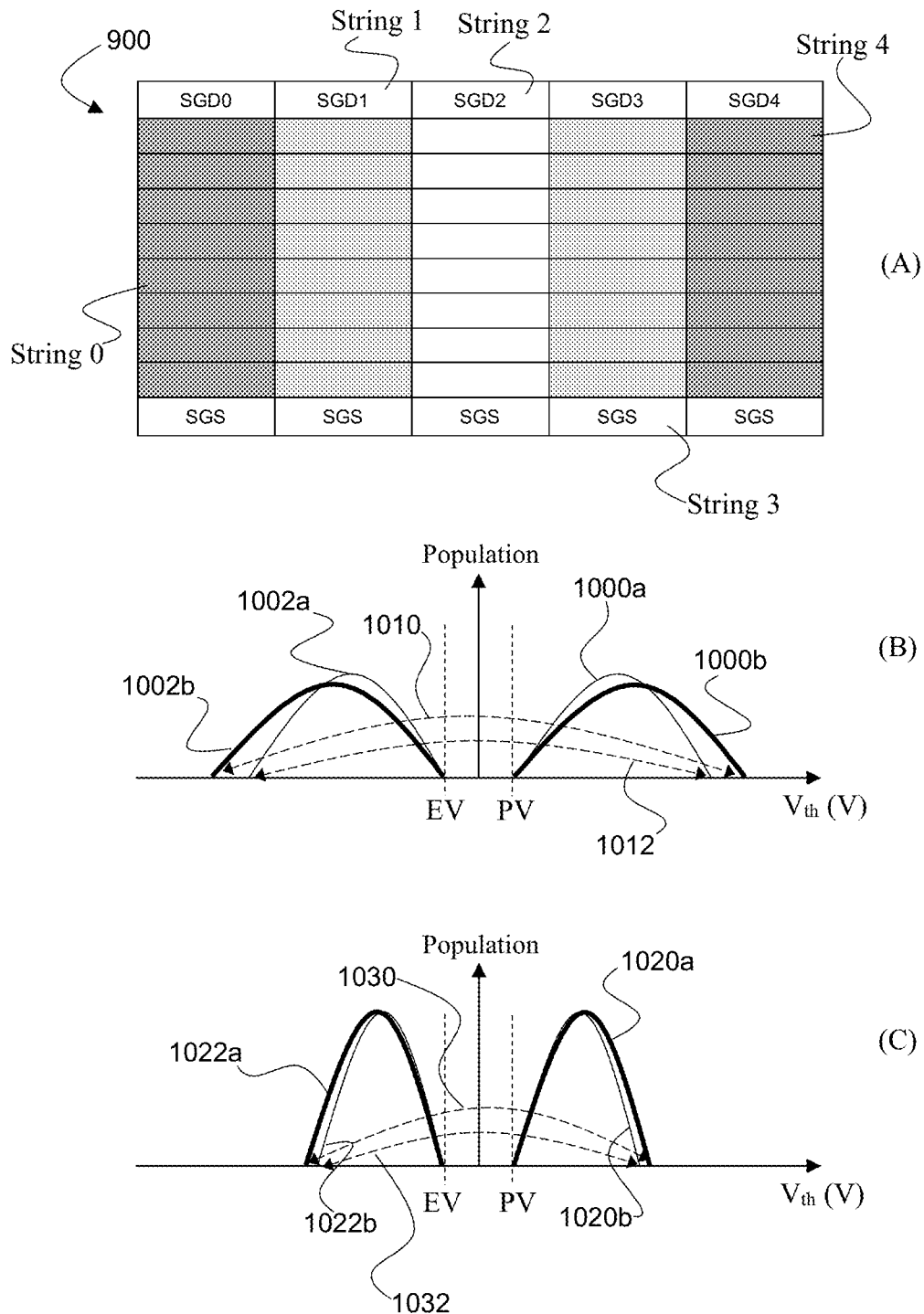
FIG. 12 diagrammatically depicts a side-by-side comparison between (1) a natural threshold voltage distribution of a "programmed" state and an "erased" state of a population of memory elements of an innermost string of the memory structure of FIG. 11B, as is evidenced over successive P/E cycles, and (2) a natural threshold voltage distribution of a "programmed" state and an "erased" state of a population of memory elements of an outermost string of the memory structure of FIG. 11B, as is evidenced over successive P/E cycles, in accordance with exemplary embodiments.

Importantly, the thickness of the oxide (MANOS) layers of a memory cell/hole is a determining factor in the natural threshold voltage (NTV) distribution exhibited by the memory cell/hole. More specifically, according to observations, a memory cell/hole having a relatively thicker MANOS layer may exhibit a wider NTV in comparison to a memory cell/hole having a relatively thinner MANOS layer, which may exhibit a tighter NTV. To demonstrate this comparative difference in electrical behavior as it relates to, for example, the example memory structure 900 of FIG. 11B, FIG. 12 generally depicts the relative NTV distributions between memory cells/holes of an outermost string (e.g., Strings 0 and 4) and memory cells/holes of an innermost string (e.g., String 2). To orient the viewer, provided in area (A) of FIG. 12 is a simplistic graphical representation of the memory structure 900 of FIG. 11B, showing the five strings (Strings 0-4), in which the outermost strings (Strings 0 and 4) are darkly shaded, the intermediate strings (Strings 1 and 3) are lightly shaded, and the innermost string (String 2) is unshaded. Shown in area (B) of FIG. 12 is a distribution plot of the natural threshold voltage (NTV) distribution of an "erased" state and a "programmed" state of memory cells/holes of an outermost string of structure 900. Specifically, curve 1000a depicts the NTV distribution of a "programmed" state after only a single P/E cycle, or a relatively low number of P/E cycles, are applied (i.e., according to a "fresh" memory block). Further, curve 1002a depicts the NTV distribution of an "erased" state, again with respect to a "fresh" block. Thus, based upon this example, dotted curve 1010 depicts the voltage swing experienced by this plotted memory cell/hole population between the "erased" and "programmed" states thereof. Similarly, curves 1000b and 1002b depict the NTV distributions of the "programmed" and "erased" states of the same memory cell/hole population after conducting a substantial number of P/E cycles (e.g., approximately 100k P/E cycles). Again, a dotted curve 1012 indicates the voltage swing that occurs between the "erased" and "programmed" states of this relatively "heavily-cycled" block. Proceeding now to area (C) of FIG. 12, there is further shown a distribution plot of the natural threshold voltage (NTV) distribution of an "erased" state and "programmed" state of the memory cells/holes of an innermost string of structure 900. Accordingly, the curves 1020a and 1022a depict, respectively, the NTV distributions of the "programmed" and "erased" states of the memory cells/holes after applying a single P/E cycle, or a relatively low number of P/E cycles, to memory structure 900. Accordingly, the dotted curve 1030 indicates the voltage swing experienced between the "erased" and "programmed" states of the memory cell/hole population occurring while in a "fresh" block condition. Continuing on, curves 1020b and 1022b depict, respectively, the NTV distributions of the "programmed" and the "erased" states of the same memory cell/hole population after the cell population is heavily cycled. As such, dotted curve 1032 indicates the voltage swing that is experienced between the "programmed" and "erased" during a P/E cycle.

Figure 13A:
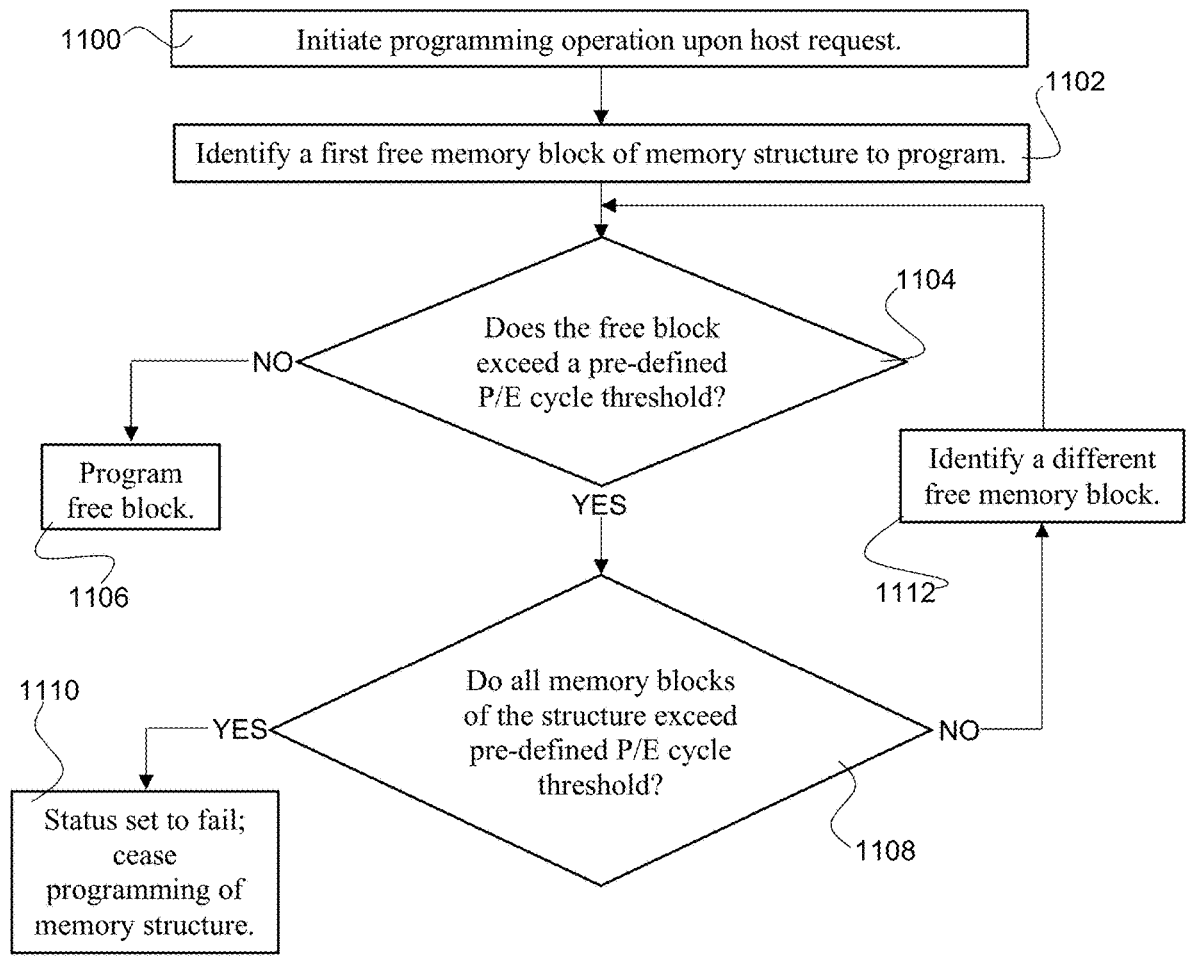
FIG. 13A is a flow diagram generally illustrating the steps of a programming memory operation that is dependent upon application of a pre-defined P/E cycle threshold count, in accordance with an exemplary embodiment.
Figure 13B:
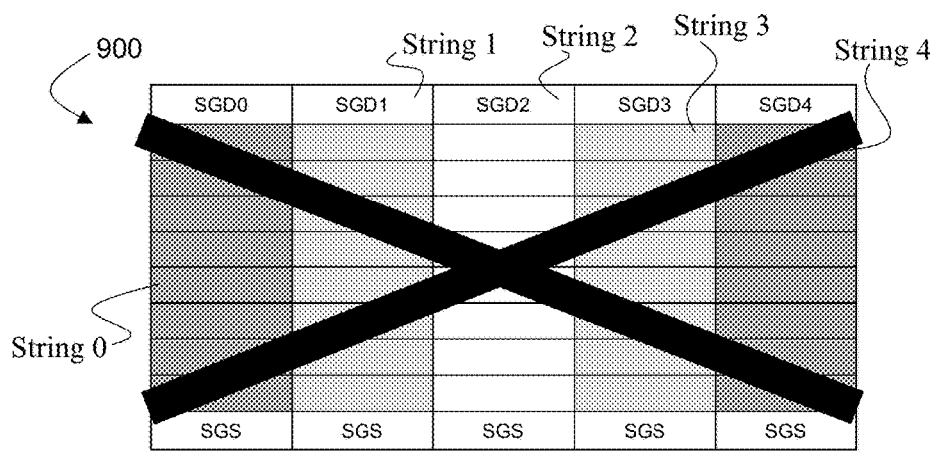
FIG. 13B is a diagrammatic illustration of the operation of FIG. 13A as applied to the memory structure of FIG. 11B, in accordance with exemplary embodiments.

Upon comparison between areas (B) and (C) of FIG. 12, it is apparent that the NTV distribution curves pertaining to the memory cells/holes of an outermost string of the memory structure 900 are significantly wider than the corresponding NTV distribution curves of the memory cells/holes of an innermost string of the structure 900. In other words, the NTV distribution of memory cells/holes located in an innermost string are significantly tighter and, therefore, may be programmed and read with greater precision, than the memory cells/holes residing in an outermost string. Furthermore, due to the wider NTV distribution with respect to the outermost string, a larger voltage swing is experienced between the low $V_{th}$ and high $V_{th}$ voltages applied over the course of a P/E cycle. According to observations, as a result of this magnitude of voltage swing, the MANOS layers of the memory cells/holes of the outermost string(s) begin to degrade over successive P/E cycles at a higher rate when compared to the memory cells/holes of the innermost string(s). Thus, this accumulated cycling degradation generally results in the outermost string failing a bit scan pass fail criteria in advance of the remaining intermediate and innermost string(s) of memory structure 900. To address this particular issue, various countermeasures may be employed. Referring now to FIGS. 13A and 13B, there is depicted a general framework and a graphical demonstration of an exemplary embodiment of such a countermeasure.

Beginning with the flow diagram in FIG. 13A, a programming operation is initiated according to programming scheme (e.g., a SLC-type programming scheme) in response to, for example, a host request (see step 1100). Next, to proceed with the programming operation, an initial or first free memory block of the subject memory structure to be programmed is then identified (indicated at step 1102). At this juncture, a determination is made as to whether the number of P/E cycles previously applied to the identified free block exceeds a pre-defined P/E cycle threshold count (see step 1104). If the number of applied P/E cycles does not surpass the threshold count, the identified free memory block is programmed accordingly at step 1106. However, if the P/E cycle threshold count is surpassed, a further determination is made as to whether all of the memory blocks comprising the structure exceed the threshold count (see step 1108). If not, a different free memory block is identified at step 1112 and the threshold determination is again made. However, if every memory block of the memory structure has exceeded the P/E cycle threshold count, the entire memory structure is summarily designated a failed status (see the graphical representation in FIG. 13B as applied to the example memory structure 900) and the programming operation of the entire memory structure ceases (see step 1110).

It should be noted that the P/E cycle threshold count may be determined according to experimental, or in situ, observations and/or data that correlates a specific P/E cycle count (or range) with failure occurrences pertaining to the outermost string(s) of a memory structure according to an applied bit scan pass fail criteria or criterion. According to one non-limiting example, this P/E cycle threshold may equal, or be in the range of, approximately 80,000 P/E cycles.

Figure 14A:
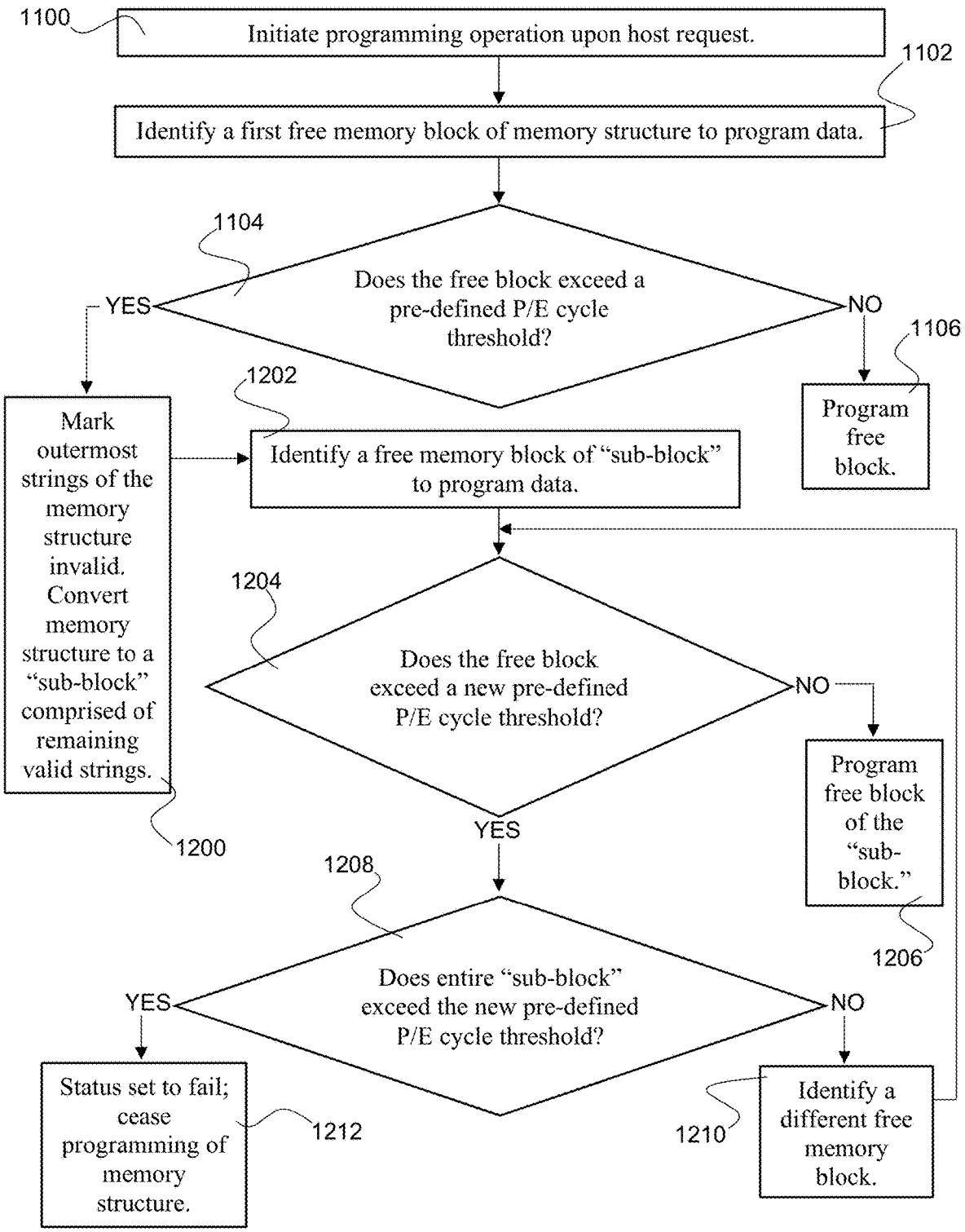
FIG. 14A is a flow diagram generally illustrating the steps of a programming memory operation that is dependent upon application of a pre-defined P/E cycle threshold count, in accordance with another exemplary embodiment.
Figure 14B:
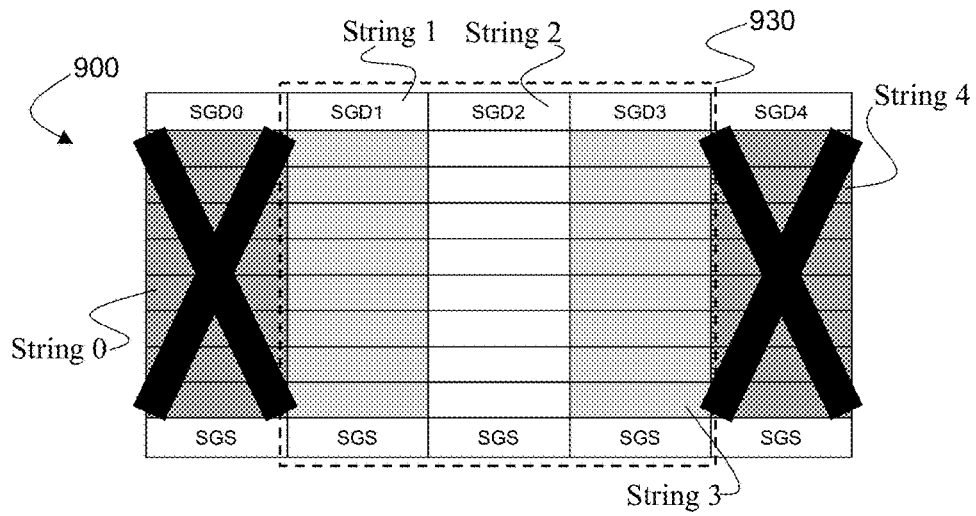
FIG. 14B is a diagrammatic illustration of the operation of FIG. 14A as applied to the memory structure of FIG. 11B, in accordance with exemplary embodiments.

As described above, the exemplary countermeasure that is depicted in FIGS. 13A and 13B results in a wholesale discontinuation of the programming life of a memory structure depending upon the pre-defined P/E cycle threshold count. However, as discussed above with reference to FIGS. 11A-B and 12, it is likely, or possible, that the memory cells/holes of the intermediate and/or innermost string(s) of the memory structure may be relatively healthy (i.e., still exhibit electrical behavior that is required for precise and reliable programming and data retention) despite the degradation exhibited at the outermost string(s). Therefore, it would be beneficial to derive a countermeasure that distinguishes between the memory elements of the outermost string(s) and the intermediate and/or innermost string(s) of a memory structure and allows for extending or prolonging a programming operation only with respect to the memory elements of the intermediate and/or the innermost string(s). In FIGS. 14A and 14B, there is generally depicted an exemplary embodiment of such a countermeasure. As shown in the flow diagram of FIG. 14A, the process according to this particular embodiment begins in the same manner as the process that is set forth in FIG. 13A, wherein an initial free memory block is identified to be programmed and an assessment is made as to whether the aggregate number of P/E cycles previously applied to the identified memory block exceeds a pre-defined P/E cycle threshold count (see steps 1100, 1102, 1104, and 1106 of FIG. 14A). However, unlike the procedure set forth in FIG. 13A, in the event that the decision is made (at step 1104) that the number of P/E cycles previously applied to the initial memory block exceeds the P/E cycle threshold count, the entire memory structure is not summarily assessed at this point in time according to the P/E cycle threshold count. Rather, at step 1200, based on the observation (and correlated assumption) that the intermediate and/or innermost string(s) of the memory structure are still in relatively good health (i.e., exhibit a suitable (tighter) NTV distribution) despite exceeding the P/E cycle threshold, only the one or more outermost string(s) of the memory structure are designated invalid (i.e., no further programming is permitted) and the memory structure is "converted" into a "sub-section" or "sub-block" comprised of the remaining valid strings (i.e., the intermediate and/or the innermost string(s)). Thereafter, to resume the programming operation, a free memory block of the "sub-block" is identified at step 1202. Continuing at step 1204, a determination is made as to whether the number of prior P/E cycles applied to the identified memory block exceeds a new, pre-defined P/E cycle threshold count, wherein the new P/E cycle threshold count is a total that is greater than the initial P/E cycle threshold count that was previously applied at step 1104. If, at step 1204, the new P/E cycle threshold count is not exceeded when applied to the identified memory block, the identified memory block is programmed accordingly (see step 1206). However, if the new P/E cycle threshold count is exceeded, a further determination is then made as to whether the new P/E cycle count is surpassed with respect to the entire "sub-block" (see step 1208). If the entire "sub-block" does not exceed the new P/E cycle threshold count, a different free memory block of the "sub-block" structure is thereafter identified to be possibly programmed (see step 1210) and the steps pertaining to the determination made with respect to the new P/E cycle threshold count is repeated. However, if the entire "sub-block" does in fact exceed the new P/E cycle threshold count, the entire memory structure is designated with a failed status and the programming operation of the memory structure ceases (see step 1212). FIG. 14B provides a graphical depiction in which the exemplary embodiment outlined in FIG. 14A is applied to, for example, the example memory structure 900 described in FIG. 11B. Accordingly, in FIG. 14B, the outermost strings (Strings 0 and 4) of the memory structure 900 are isolated from further programming and the intermediate and/or innermost strings (Strings 1, 2, and 3) are together converted into a "sub-block" 930 of which further programming is permitted until the new P/E cycle threshold count is reached.

As mentioned above, the new pre-defined P/E cycle threshold count that is applied in step 1204 of the exemplary embodiment in FIG. 14A may be any suitable number, or suitable range, that is greater than the initial pre-defined P/E cycle threshold count that is applied at step 1104, thereby allowing for continued programming of the memory "sub-block." This new P/E cycle threshold count may be any suitable P/E cycle count that is, for example, determined according to experimental and/or in situ observations or data indicating when an intermediate and/or an innermost string of a given memory structure may begin to exhibit and/or endure a certain degree of material degradation that adversely impacts its electrical behavior or characteristics such that the efficiency of the memory device, and/or the data reliability or retention, is no longer within an acceptable standard. One example of such a suitable new (extended) P/E cycle threshold count may be a total of 100,000 P/E cycles. Therefore, in the circumstance in which the initial pre-defined P/E cycle threshold count is, for example, approximately 80,000 P/E cycles, this new P/E cycle threshold count of approximately 100,000 P/E cycles would allow for an extended 20,000 P/E cycles with respect to this memory "sub-block."

Figure 15:
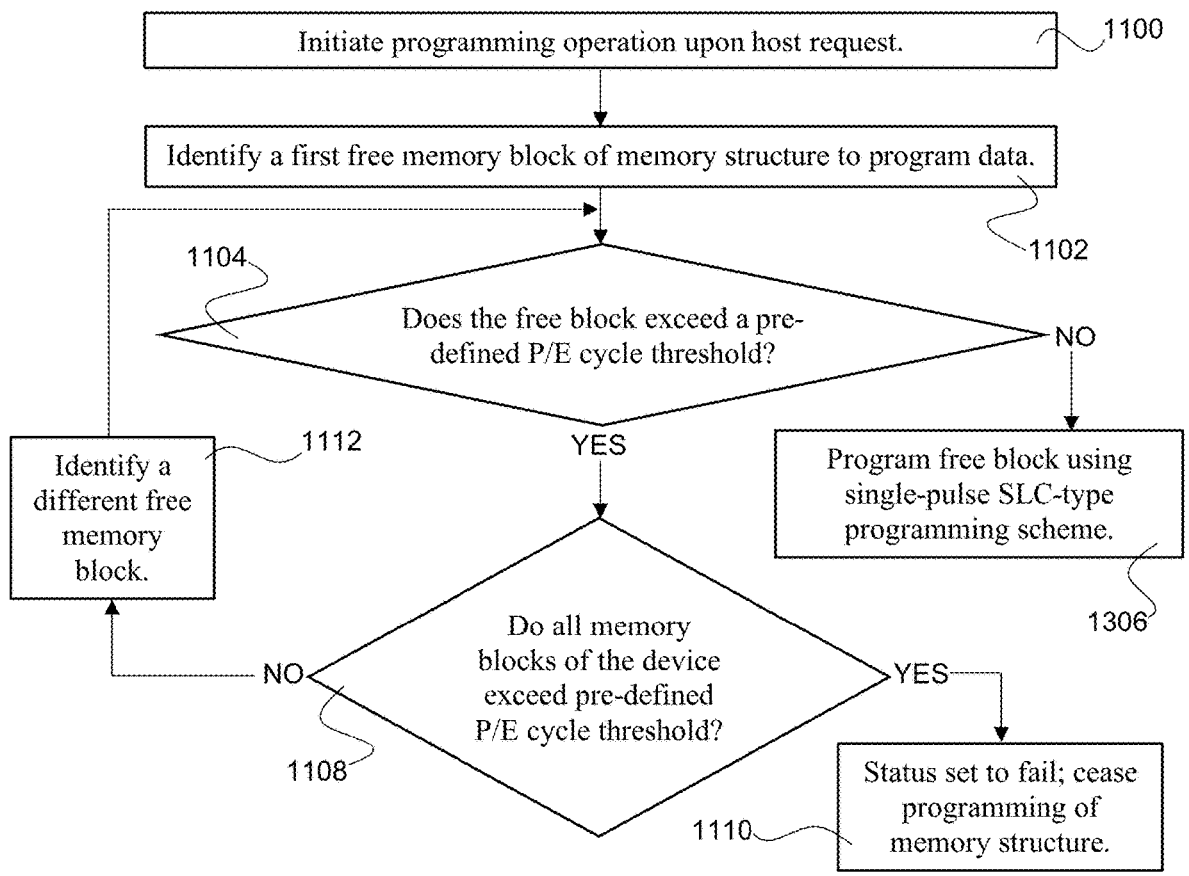
FIG. 15 is a flow diagram generally illustrating the steps of a programming memory operation that is dependent upon application of a pre-defined P/E cycle threshold count, in accordance with a further exemplary embodiment.
Figure 16:
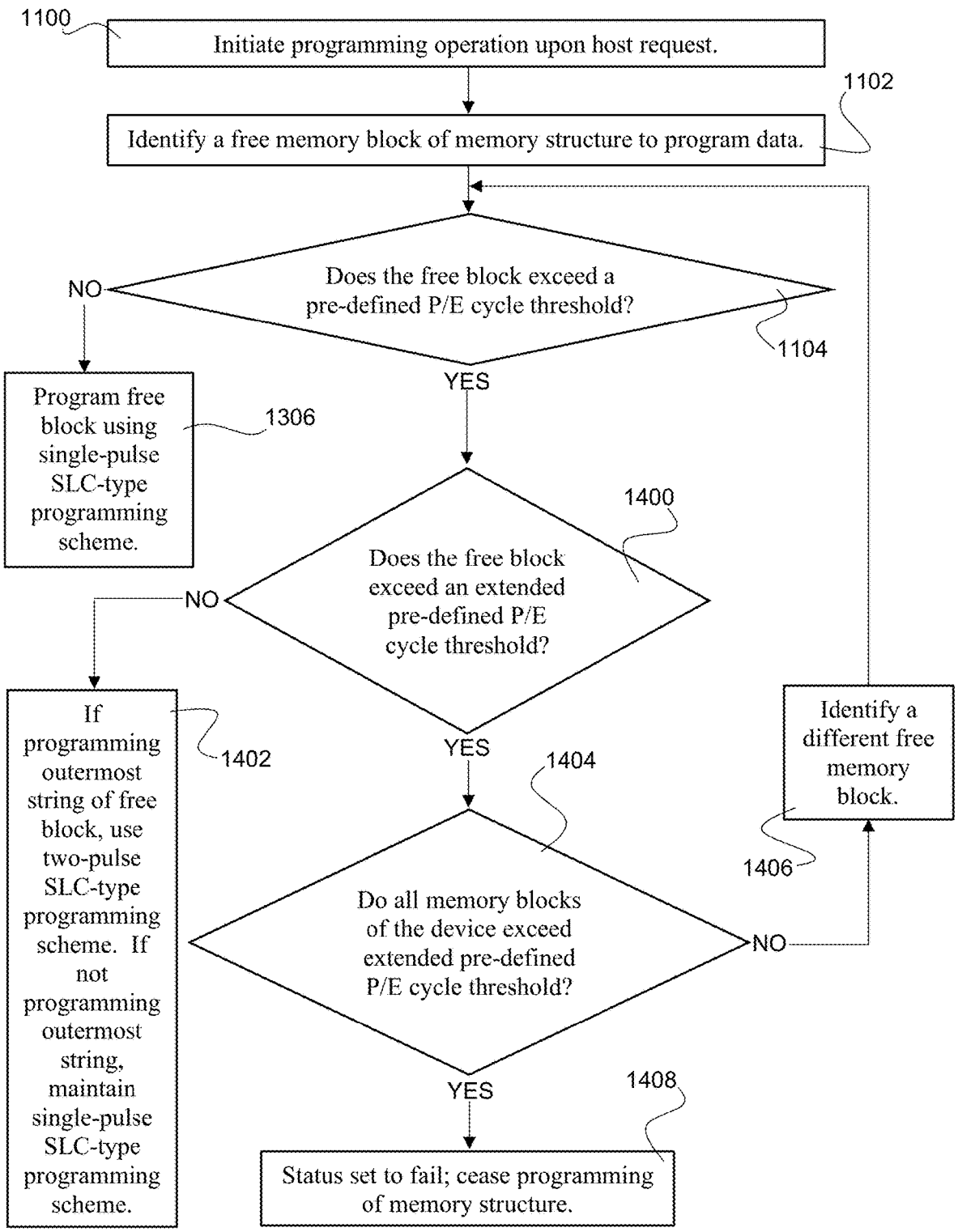
FIG. 16 is a flow diagram generally illustrating the steps of a programming memory operation that is dependent upon a location of a target memory element within an exemplary memory structure, in accordance with an exemplary embodiment.
Figure 17:
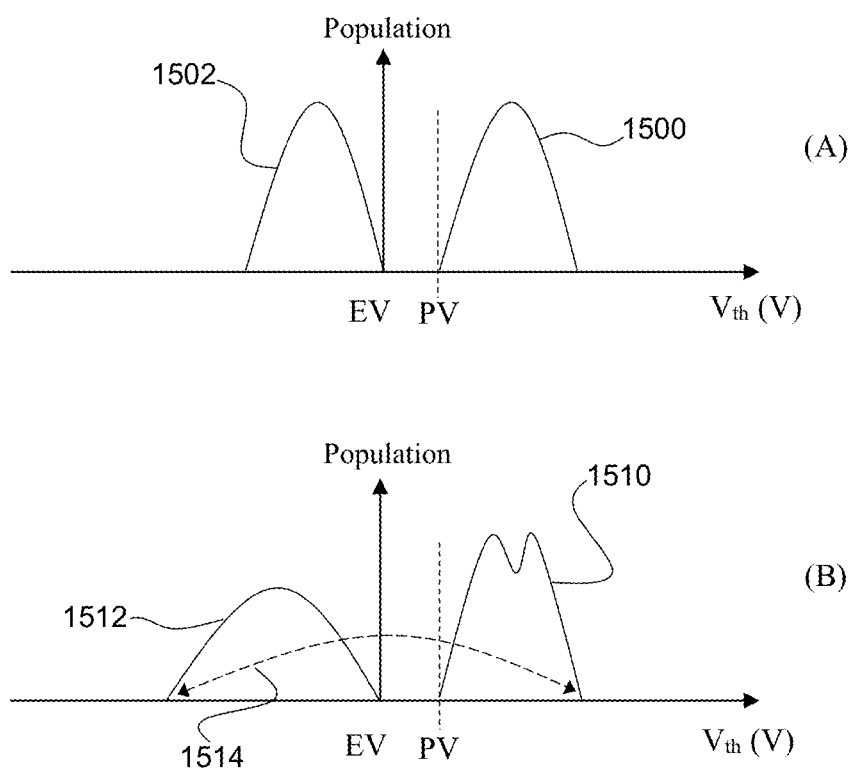
FIG. 17 is a diagrammatic illustration of the impact of the operation of FIG. 16 on a natural threshold voltage distribution of an exemplary memory structure, in accordance with exemplary embodiments.

Referring now to FIGS. 15-17, there is described another, or further, example of an exemplary embodiment of a countermeasure that seeks to address the issue of extending the memory life of a memory structure despite the variable material or structural degradation experienced between the outermost, intermediate, and innermost strings over the course of accumulated P/E cycles. In this particular exemplary embodiment, the memory structure is comprised of memory elements being programmed with binary data according to a SLC-type programming scheme. As discussed above, an SLC-type programming scheme is typically comprised of just a single programming loop in which a single programming pulse is applied. Thus, reprogramming according to an SLC-type programming scheme comprises a single P/E cycle. Due to the single-pulse nature of SLC-type programming, these memory elements experience a significantly higher number of P/E cycles over their lifetime when compared to memory elements having a greater number of programmable states (e.g., TLC or QLC-type memory elements). Therefore, in a higher density BiCS-type scalable memory structure (e.g., structure 900 of FIG. 11B), there is an elevated risk of material "wear-and-tear" degradation occurring with respect to memory elements undergoing a SLC-type programming scheme. As such, beginning with FIG. 15, there is generally depicted an exemplary embodiment of a countermeasure procedure comprised of the identical steps outlined above according to the exemplary embodiment of FIG. 13A. However, where step 1106 in FIG. 13A comprises programming a free memory block that has not yet endured an aggregate P/E cycle count that exceeds a pre-defined P/E cycle threshold count, a corresponding step 1306 in the process illustrated in FIG. 15 expressly specifies that the programming of the free memory block is according to a single-pulse SLC-type programming scheme.

Referring now to FIG. 16, there is generally depicted an exemplary embodiment of a modification to the countermeasure procedure set forth in FIG. 15. In this modification, the objective is to prolong the useful programming life of the outermost string(s) of the memory structure, wherein, as indicated above, a SLC-type programming scheme is being applied to the memory structure. Specifically, at the juncture in which a determination is first made that an initially identified free memory block has undergone a sum total of P/E cycles that exceeds an initial pre-defined P/E cycle threshold count (see step 1104), an additional determination is subsequently made as to whether the identified free memory block exceeds an extended pre-defined P/E cycle threshold count (see step 1400), wherein the extended P/E cycle threshold is larger than the initial P/E cycle threshold count applied at step 1104. If the extended P/E cycle threshold count is not surpassed, the programming of the identified free block nonetheless commences despite that the free block has exceeded the initial P/E cycle threshold count (as ascertained at step 1104). In order to accomplish this task in a manner that extends the useful programming life of the memory structure, rather than applying a single-pulse SLC-type programming scheme to the embattled outermost string(s) of the block, programming of the outermost string(s) is conducted by applying, for example, a two-pulse, or an otherwise multi-pulse, SLC-type programming scheme (see step 1402), for a limited duration until the extended P/E cycle threshold count is exceeded (see step 1400). Further, it is noted that, with respect to the intermediate and/or innermost string(s) of the block, a single-pulse SLC-type programming scheme is still applied.

Returning back to step 1400 of the exemplary embodiment set forth in FIG. 16, in the event that the identified free block exceeds the extended P/E cycle threshold count, a further inquiry is made as to whether the memory blocks of the entire memory structure exceed the extended P/E cycle threshold count (see step 1404). If the P/E cycle threshold is surpassed with respect to every memory block, the entire memory structure is designated with a fail status and programming of the entire memory structure ceases (see step 1408). However, if the P/E cycle threshold is not exceeded with respect to one or more memory blocks of the structure, this programming continues by identifying another free memory block of the memory structure, wherein the free memory block is different from the initial free memory block that was first identified at step 1102. Thereafter, the programming process generally set forth beginning with step 1104 (of FIG. 16) is repeated with respect to the newly-identified free memory block.

Referring now to FIG. 17, the distribution plots depicted therein are intended to demonstrate the impact of switching to a two-pulse (or multi-pulse) SLC-type programming scheme to the outermost string(s). In area (A) of FIG. 17, generally depicted are the natural threshold voltage (NTV) distribution curves of the "programmed" and the "erased" states, 1500 and 1502, respectively, of a population of memory cells/holes located at an intermediate or an innermost string of an example memory structure (such as the structure 900 of FIG. 11B), at a point in time in which the memory structure has undergone a number of P/E cycles totaling somewhere in the range between the initial and extended pre-defined P/E cycle thresholds specified in steps 1104 and 1400 of the exemplary embodiment that is depicted in FIG. 16. As illustrated, both of the distribution curves 1500 and 1502 are relatively narrow in width and, therefore, indicate that the memory cells/holes of the intermediate or innermost string(s) still remain in good health with respect to the SLC-type programming scheme. Turning now to area (B) of FIG. 17, there is generally shown the NTV distribution curves of the "programmed" and "erased" states, 1510 and 1512 respectively, of a population of memory cells/holes located at an outermost string of the same memory structure and at the same juncture in the programming life at focus above in area (A). Importantly, the NTV distribution curve 1510 with respect to the "programmed" state indicates that two program pulses are applied during a single SLC-type programming loop. As shown, the two-pulse programming scheme results in a tighter NTV distribution, thereby maintaining the data retention and reliability while still achieving the same memory capacity. Further, the tighter NTV distribution reduces the magnitude of the voltage swing (indicated by the dotted arrow 1514) experienced over the course of a single P/E cycle, thereby reducing the amount of damage inflicted upon the MANOS layer(s) of the memory cells/holes as a consequence of the P/E cycling.

It should be noted that the parameters of both the initial and extended pre-defined P/E cycle threshold count may be derived and dependent upon experimental and/or in situ data or observations regarding the physical/structural correlation between the number of P/E cycles applied and the degree of change in the material integrity and/or the electrical behavior of the subject memory device. According to one example, the initial pre-defined P/E cycle threshold count may be set at approximately 80,000 P/E cycles and the extended pre-defined P/E cycle threshold may be set at approximately 100,000 P/E cycles such that the two-pulse (or the multi-pulse) programming scheme extends the useful life of the outermost string(s) of the subject memory structure by approximately 20,000 P/E cycles.

Additionally, it may be possible to incorporate together into a single process the exemplary embodiments set forth in FIGS. 14A and 16. For example, the procedure set forth in FIG. 16 for modifying a SLC-type programming scheme to take on a two-pulse programming scheme with respect the outermost string(s) of a subject memory structure may first be applied until a pre-defined extended P/E cycle threshold count is exceeded. Subsequently, the procedure depicted in FIG. 14A may then be applied to prohibit from further programming the outermost string(s) of the memory structure while defining a smaller "sub-block" comprised of the intermediate or innermost string(s) of the memory structure that may still be programmed according to a further-extended pre-defined P/E cycle threshold count, thereby continuing to extract as much useful programming life from the memory structure as possible. Importantly, the example just described is one non-limiting example. The exemplary embodiments depicted in FIGS. 14A and 16 may be combined, partially or entirely, in various ways to achieve the same overall objectives of the present disclosure.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. For example, in the description set forth above, the various P/E cycle threshold count(s) are referred to as "pre-defined." However, it is entirely conceivable, according to the spirit of the present disclosure, that any P/E cycle threshold count may be dynamically sensed, derived, and/or generated while the subject memory device is in use. Therefore, it is not required that any P/E cycle threshold count remain static throughout the life cycle of the memory device. Rather, the P/E cycle threshold count may be modified or changed over the course of the programming life. It is intended that the following claims be interpreted to embrace all such variations and modifications.

What is claimed is:

1. A method for programming a memory block of a memory structure of a non-volatile memory system, comprising:
   determining whether a number of programming/erase cycles previously applied to a first memory block of the memory structure exceeds a first pre-defined programming/erase cycle threshold count; and
   in response to a determination that the first pre-defined programming/erase cycle threshold count is exceeded:
   designating one or more outermost memory strings of the first memory block as invalid, wherein the one or more outermost memory strings of the first memory block designated as invalid cannot be further programmed in any subsequent programming/erase cycles;
   defining, within the first memory block, a memory sub-block that is comprised of all valid memory strings of the first memory block and does not include the one or more outermost memory strings of the first memory block designated as invalid; and
   identifying a free memory block of the memory sub-block to be programmed.

2. The method according to claim 1, further comprising:
   determining whether a number of programming/erase cycles previously applied to the free memory block of the memory sub-block exceeds an extended pre-defined programming/erase cycle threshold count, wherein the extended pre-defined programming/erase cycle threshold count is greater than the first pre-defined programming/erase cycle threshold count; and
   if the extended pre-defined programming/erase cycle threshold count is not exceeded, programming the free memory block of the memory sub-block.

3. The method according to claim 1, further comprising:
   determining whether a number of programming/erase cycles previously applied to the free memory block of the memory sub-block exceeds an extended pre-defined programming/erase cycle threshold count, wherein the extended pre-defined programming/erase cycle threshold count is greater than the first pre-defined programming/erase cycle threshold count; and
   if the extended pre-defined programming/erase cycle threshold count is exceeded:
   determining whether a number of programming/erase cycles previously applied to an entirety of the memory sub-block exceeds the extended pre-defined programming/erase cycle threshold count;
   if the extended pre-defined programming/erase cycle threshold count is not exceeded, identifying a different free memory block of the memory sub-block to be programmed; and if the extended pre-defined programming/erase cycle threshold count is exceeded, ceasing programming of the memory structure.

4. The method according to claim 2, wherein the:
first pre-defined programming/erase cycle threshold count is approximately 80,000 P/E cycles; and
extended pre-defined programming/erase cycle threshold count is approximately 100,000 P/E cycles.

5. The method according to claim 3, wherein the:
first pre-defined programming/erase cycle threshold count is approximately 80,000 P/E cycles; and
extended pre-defined programming/erase cycle threshold count is approximately 100,000 P/E cycles.

6. The method according to claim 1, wherein the memory sub-block comprises at least one innermost memory string of the first memory block.

7. The method according to claim 1, wherein the memory structure comprises:
a vertical three-dimensional NAND-type memory structure having a plurality of SLC-type programmable memory elements.

8. A method for programming a memory block of a memory structure of a non-volatile memory system, comprising:
determining whether a number of programming/erase cycles previously applied to a first memory block of the memory structure exceeds a first pre-defined programming/erase cycle threshold count; and
if the first pre-defined programming/erase cycle threshold count is exceeded:
determining whether the number of programming/erase cycles previously applied to the first memory block exceeds an extended pre-defined programming/erase cycle threshold count, wherein the extended pre-defined programming/erase cycle threshold count is greater than the first pre-defined programming/erase cycle threshold count; and
if the extended pre-defined programming/erase cycle threshold count is not exceeded, programming the first memory block by:
applying a two-pulse per programming loop scheme to each outermost memory string of the first memory block; and
applying a single-pulse per programming loop scheme to all other memory strings of the first memory block.

9. The method according to claim 8, further comprising:
if the extended pre-defined programming/erase cycle threshold count is exceeded:
determining whether a number of programming/erase cycles previously applied to an entirety of the memory structure exceeds the extended pre-defined programming/erase cycle threshold count; and
if the extended pre-defined programming/erase cycle threshold count is exceeded, cease programming of the memory structure.

10. The method according to claim 8, further comprising:
if the extended pre-defined programming/erase cycle threshold count is not exceeded, identifying a different free memory block of the memory structure to be programmed.

11. The method according to claim 8, wherein the:
first pre-defined programming/erase cycle threshold count is approximately 80,000 P/E cycles; and
extended pre-defined programming/erase cycle threshold count is approximately 100,000 P/E cycles.

12. The method according to claim 8, wherein the single-pulse per programming loop scheme is applied to at least one innermost memory string of the first memory block.

13. The method according to claim 8, wherein the memory structure comprises:
a vertical three-dimensional NAND-type memory structure having a plurality of SLC-type programmable memory elements.

14. A memory controller, comprising:
a first communication pathway configured to couple to a non-volatile memory structure; and
the memory controller configured to:
determine whether a number of programming/erase cycles previously applied to a first memory block of the memory structure exceeds a first pre-defined programming/erase cycle threshold count; and
in response to a determination that the first pre-defined programming/erase cycle threshold count is exceeded:
designate one or more outermost memory strings of the first memory block as invalid, wherein the one or more outermost memory strings of the first memory block designated as invalid cannot be further programmed in any subsequent programming/erase cycles;
define, within the first memory block, a memory sub-block comprised of all valid memory strings of the first memory block and does not include the one or more outermost memory strings of the first memory block designated as invalid; and
identify a free memory block of the memory sub-block to be programmed.

15. The memory controller according to claim 14, wherein the memory controller is further configured to:
determine whether a number of programming/erase cycles previously applied to the free memory block of the memory sub-block exceeds an extended pre-defined programming/erase cycle threshold count, wherein the extended pre-defined programming/erase cycle threshold count is greater than the first pre-defined programming/erase cycle threshold count; and
if the extended pre-defined programming/erase cycle threshold count is not exceeded, program the free memory block of the memory sub-block.

16. The memory controller according to claim 14, wherein the memory controller is further configured to:
determine whether a number of programming/erase cycles previously applied to the free memory block of the memory sub-block exceeds an extended pre-defined programming/erase cycle threshold count, wherein the extended pre-defined programming/erase cycle threshold count is greater than the first pre-defined programming/erase cycle threshold count; and
if the extended pre-defined programming/erase cycle threshold count is exceeded:
determine whether a number of programming/erase cycles previously applied to an entirety of the memory sub-block exceeds the extended pre-defined programming/erase cycle threshold count;
if the extended pre-defined programming/erase cycle threshold count is not exceeded, identify a different free memory block of the memory sub-block to be programmed; and
if the extended pre-defined programming/erase cycle threshold count is exceeded, cease programming of the memory structure.

17. The memory controller according to claim 15, wherein the:
   first pre-defined programming/erase cycle threshold count is approximately 80,000 P/E cycles; and
   extended pre-defined programming/erase cycle threshold count is approximately 100,000 P/E cycles.

18. The memory controller according to claim 16, wherein the:
   first pre-defined programming/erase cycle threshold count is approximately 80,000 P/E cycles; and
   extended pre-defined programming/erase cycle threshold count is approximately 100,000 P/E cycles.

19. The memory controller according to claim 14, wherein the memory sub-block comprises at least one innermost memory string of the first memory block.

20. The memory controller according to claim 14, wherein the memory structure comprises:
   a vertical three-dimensional NAND-type memory structure having a plurality of SLC-type programmable memory elements.

* * * * *